(12) United States Patent
Cheng et al.

(10) Patent No.: US 12,009,403 B2
(45) Date of Patent: *Jun. 11, 2024

(54) SEMICONDUCTOR STRUCTURE WITH METAL CAP LAYER AND METHOD FOR MANUFACTURING THE SAME

(71) Applicant: Taiwan Semiconductor Manufacturing Company, Ltd., Hsinchu (TW)

(72) Inventors: Chung-Liang Cheng, Changhua County (TW); Ziwei Fang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 83 days.

This patent is subject to a terminal disclaimer.

(21) Appl. No.: 17/830,059

(22) Filed: Jun. 1, 2022

(65) Prior Publication Data
US 2022/0293765 A1    Sep. 15, 2022

Related U.S. Application Data

(63) Continuation of application No. 17/079,885, filed on Oct. 26, 2020, now Pat. No. 11,393,912, which is a
(Continued)

(51) Int. Cl.
| | |
|---|---|
| *H01L 29/49* | (2006.01) |
| *H01L 21/02* | (2006.01) |
| *H01L 21/28* | (2006.01) |
| *H01L 21/285* | (2006.01) |
| *H01L 21/311* | (2006.01) |

(Continued)

(52) U.S. Cl.
CPC .... *H01L 29/4983* (2013.01); *H01L 21/02178* (2013.01); *H01L 21/02334* (2013.01); *H01L 21/28026* (2013.01); *H01L 21/28512* (2013.01); *H01L 21/31116* (2013.01); *H01L 21/31144* (2013.01); *H01L 29/45* (2013.01); *H01L 29/66795* (2013.01); *H01L 29/7851* (2013.01)

(58) Field of Classification Search
CPC ............. H01L 29/4983; H01L 29/7851; H01L 21/31144; H01L 21/02334; H01L 21/02178; H01L 21/28512; H01L 29/66795; H01L 21/31116; H01L 21/28026; H01L 29/45
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |

(Continued)

*Primary Examiner* — Karen Kusumakar
(74) *Attorney, Agent, or Firm* — Birch, Stewart, Kolasch & Birch, LLP

(57) ABSTRACT

Semiconductor structures and method for forming the same are provided. The semiconductor structure includes a fin protruding from a substrate and a gate stack formed across the fin. The semiconductor structure further includes a source/drain structure attaching to the gate stack and a contact structure connecting to the source/drain structure. The semiconductor structure further includes a first cap layer covering a top surface of the contact structure. In addition, the first cap layer includes a first halogen.

20 Claims, 25 Drawing Sheets

Related U.S. Application Data continuation of application No. 16/427,102, filed on May 30, 2019, now Pat. No. 10,818,768.

(51) Int. Cl.
*H01L 29/45* (2006.01)
*H01L 29/66* (2006.01)
*H01L 29/78* (2006.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 10,297,511 B2 | 5/2019 | Li |
| 10,685,840 B2 | 6/2020 | Shu et al. |
| 2014/0070333 A1* | 3/2014 | Cheng ............ H01L 29/78 257/411 |
| 2014/0162452 A1 | 6/2014 | Cheng et al. |
| 2020/0144118 A1 | 6/2020 | Cheng et al. |

\* cited by examiner

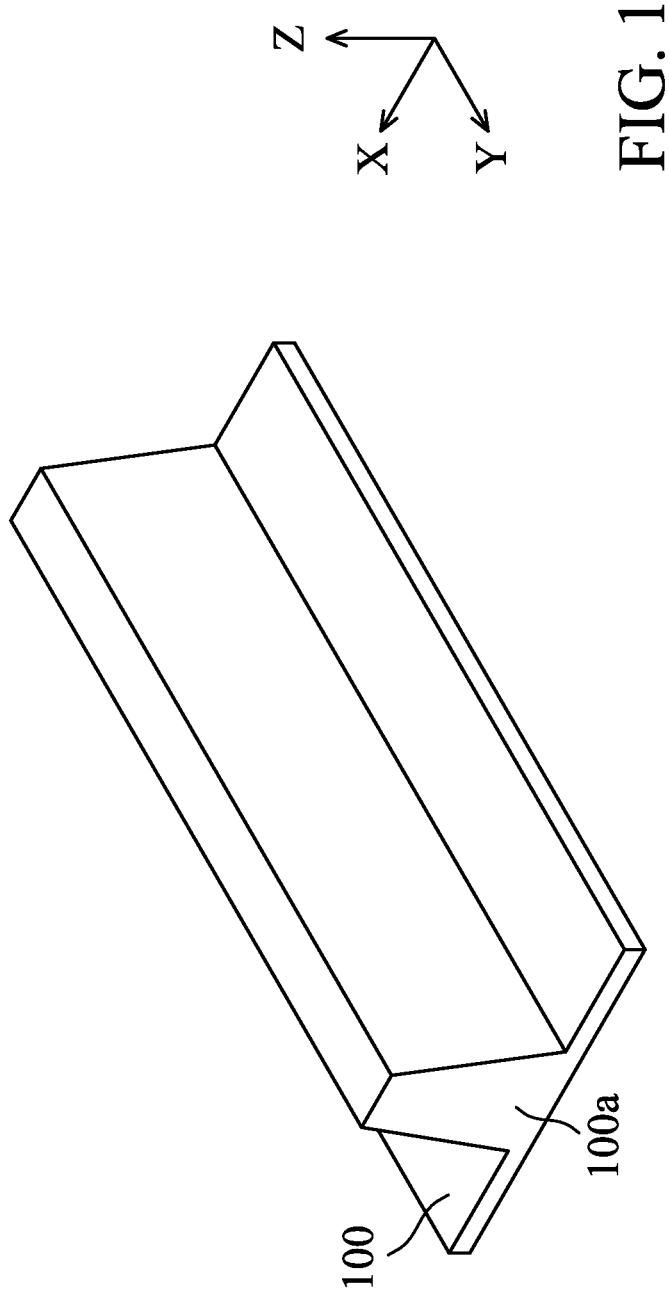

SEMICONDUCTOR STRUCTURE WITH METAL CAP LAYER AND METHOD FOR MANUFACTURING THE SAME

PRIORITY CLAIM AND CROSS-REFERENCE

This application is a Continuation application of U.S. patent application Ser. No. 17/079,885 filed on Oct. 26, 2020, which is application is a Continuation application of U.S. patent application Ser. No. 16/427,102 filed on May 30, 2019, the entirety of which are incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

Although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A, 1B, 1C, 1D, and 1E are a series of perspective views illustrating various stages of a method for forming a semiconductor structure in accordance with some embodiments.

DETAILED DESCRIPTION

Figure 1B:
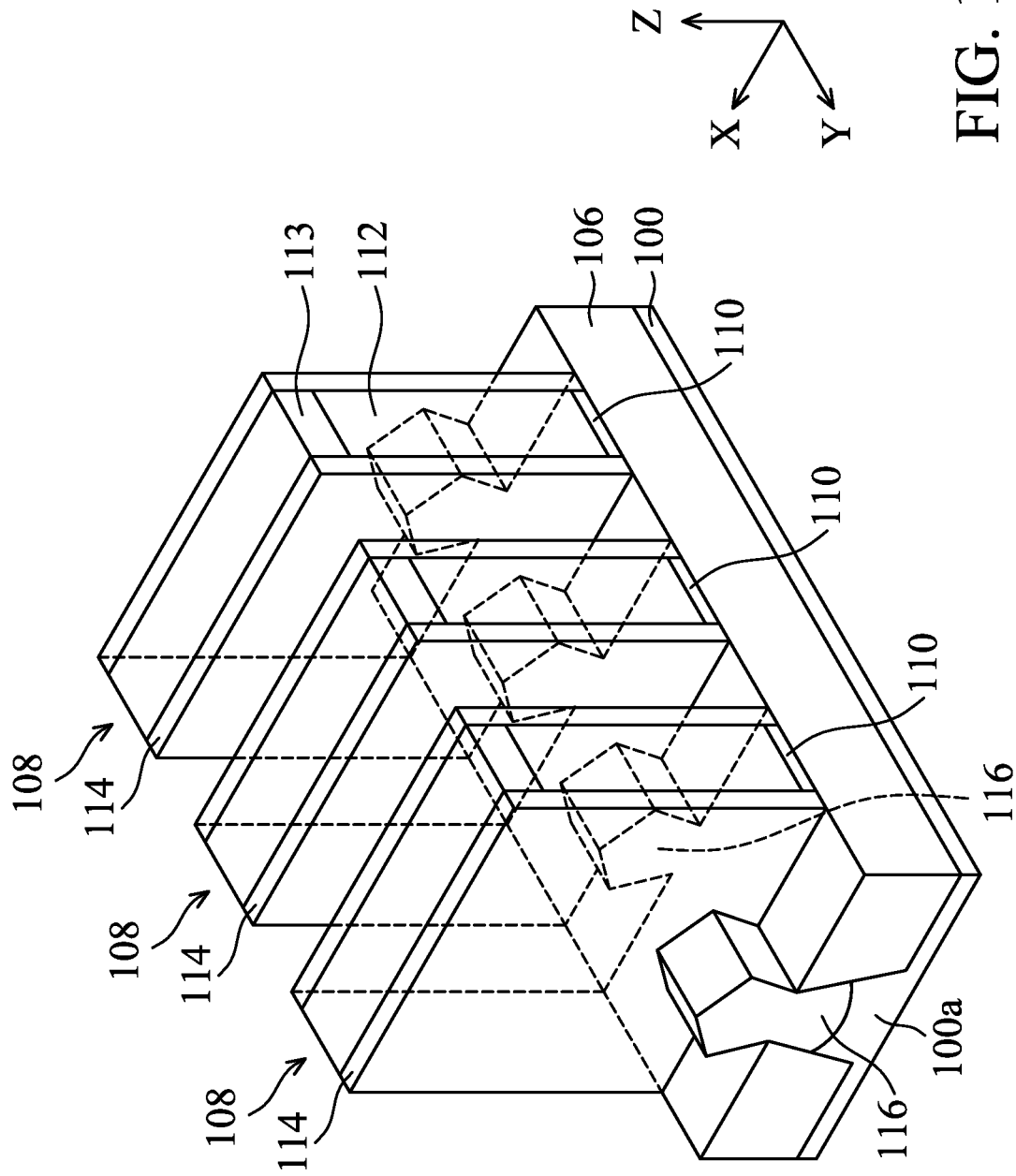

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The fin structures (e.g., semiconductor fins) described below may be patterned using any suitable method. For example, the fins may be patterned using one or more lithography processes, including double-patterning or multi-patterning processes. Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

Embodiments of methods for forming semiconductor structures are provided. The method may include forming a first halogen-containing metal cap layer on a gate electrode layer and forming a second halogen-containing metal cap layer on a contact structure. The first halogen-containing metal cap layer and the second halogen-containing metal cap layer may protect the gate electrode layer and the contact structure during subsequent processes (e.g., an etching process), so that the gate resistance and the contact resistance of the semiconductor structure may be low. The first halogen-containing metal cap layer and the second halogen-containing metal cap layer may include different halogens, so that the process for forming the second halogen-containing metal cap layer may use a precursor gas that is different from the precursor gas used in the process for forming the first halogen-containing metal cap layer. Therefore, the process for forming the second halogen-containing metal cap layer may not substantially damage the contact structure.

FIGS. 1A, 1B, 1C, 1D, and 1E are a series of perspective views illustrating various stages of a method for forming a semiconductor structure in accordance with some embodiments of the present disclosure. FIGS. 2A, 2B, 2C, 2D, 2E, 2F, 2G, 2H, 2I, 2J, 2K, 2L, 2M, 2N, 2O, and 2P are a series of cross-sectional views taken along line A-A' shown in FIG. 1E.

A semiconductor substrate 100 is provided, as shown in FIG. 1A in accordance with some embodiments. The semiconductor substrate 100 may be a semiconductor wafer such as a silicon wafer. The semiconductor substrate 100 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the semiconductor substrate 100 includes an epitaxial layer. For example, the semiconductor substrate 100 may have an epitaxial layer overlying a bulk semiconductor. In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable process, or a combination thereof.

Various active elements (not shown) may be formed in and/or over the semiconductor substrate 100. Examples of the various active elements include transistors, diodes, another applicable element, or a combination thereof. For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs). In some embodiments, the semiconductor substrate 100 includes a fin field effect transistor (FinFET). Various passive elements (not shown) may be formed in and/or over the semiconductor substrate 100. Examples of the various passive elements include capacitors, inductors, resistors, another applicable passive element, or a combination thereof. Various processes, such as front-end-of-line (FEOL) semiconductor fabrication processes, may be performed to form the various active elements and passive elements. The FEOL semiconductor fabrication processes may include deposition, etching, implantation, lithography, annealing, planarization, one or more other applicable processes, or a combination thereof.

Afterwards, the semiconductor substrate 100 is patterned to form a semiconductor fin 100a, as shown in FIG. 1A in accordance with some embodiments. The semiconductor fin 100a may protrude from the semiconductor substrate 100 along direction Z perpendicular to the top surface of the semiconductor substrate 100, as shown in FIG. 1A. The semiconductor fin 100a may extend in direction Y, as shown in FIG. 1A, and direction Y may be the lengthwise direction of the semiconductor fin 100a. Direction X may be perpendicular to direction Y, as shown in FIG. 1A, and direction X may be the widthwise direction of the semiconductor fin 100a.

In some embodiments, the semiconductor fin 100a has tapered sidewalls. For example, the semiconductor fin 100a may have a width that gradually increases from the top portion to the lower portion.

Although FIG. 1A illustrates only one semiconductor fin 100a, multiple semiconductor fins (e.g., multiple semiconductor fins 100a) may be formed on the semiconductor substrate 100 in accordance with some embodiments of the present disclosure. These semiconductor fins formed on the semiconductor substrate 100 may be parallel to each other in their lengthwise directions.

In some embodiment, before the semiconductor substrate 100 is patterned to form the semiconductor fin 100a, a first mask layer (not shown in the figures) and a second mask layer (not shown in the figures) are successively formed over the semiconductor substrate 100. In some embodiments, the first mask layer serves a buffer layer or an adhesion layer that is formed between the underlying semiconductor substrate 100 and the overlying second mask layer. The first mask layer may also be used as an etch stop layer when the second mask layer is removed or etched.

In some embodiments, the first mask layer is made of silicon oxide. In some embodiments, the first mask layer is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on coating process, another applicable process, or a combination thereof.

In some embodiments, the second mask layer is made of silicon oxide, silicon nitride, silicon oxynitride, another applicable material, or a combination thereof. In some embodiments, the second mask layer is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on coating process, another applicable process, or a combination thereof.

In some embodiments, after the formation of the first mask layer and the second mask layer, the first mask layer and the overlying second mask layer are patterned by a photolithography process and an etching process, so as to expose portions of the semiconductor substrate 100. For example, the photolithography process may include photoresist coating (e.g., spin-on coating), soft baking, mask aligning, exposure, post-exposure baking, developing the photoresist, rinsing and drying (e.g., hard baking). Moreover, the etching process may be a dry etching process, such as a reactive ion etching (RIE) process, a neutral beam etching (NBE) process, the like, or a combination thereof.

Afterwards, an etching process is performed on the semiconductor substrate 100 to form the semiconductor fin 100a by using the patterned first mask layer and the patterned second mask layer as an etch mask, in accordance with some embodiments. In some embodiments, the etching process includes a dry etching process, a wet etching process, or a combination thereof. In some embodiments, the semiconductor substrate 100 is etched by a dry etching process, such as an RIE process, an NBE process, the like, or a combination thereof. The dry etching process may be performed using a process gas including fluorine-based etchant gas. For example, the process gas may include $SF_6$, $C_xF_y$ (x and y are both integers), $NF_3$, or a combination thereof.

After the semiconductor fin 100a is formed, an isolation structure 106 is formed over the semiconductor substrate 100, and the semiconductor fin 100a is surrounded by the isolation structure 106, as shown in FIG. 1B in accordance with some embodiments. The isolation structure 106 may be formed by depositing an insulating layer over the semiconductor substrate 100 and recessing the insulating layer. In some embodiments, the isolation structure 106 is made of silicon oxide, silicon nitride, silicon oxynitride, fluoride-doped silicate glass (FSG), other applicable dielectric materials, or a combination thereof. In some embodiments, the isolation structure 106 includes a shallow trench isolation (STI) structure.

Afterwards, dummy gate stacks 108 are formed across the semiconductor fin 100a and extend over the isolation structure 106, as shown in FIG. 1B in accordance with some embodiments. Each of the dummy gate stacks 108 may include a dummy gate dielectric layer 110, a dummy gate electrode layer 112, and a cap layer 113.

The dummy gate dielectric layers 110 may be made of silicon oxide, other applicable dielectric materials, or a combination thereof. The dummy gate electrode layers 112 may be made of poly-silicon, other applicable materials, or a combination thereof. The cap layers 113 may be made of silicon nitride, other applicable materials, or a combination thereof. The dummy gate dielectric layers 110, the dummy gate electrode layers 112, and the cap layers 113 may be formed by suitable deposition processes (e.g., chemical vapor deposition process).

After the dummy gate stacks 108 are formed, sidewall spacers 114 are formed on sidewalls of the dummy gate stacks 108, as shown in FIG. 1B in accordance with some embodiments. In some embodiments, the sidewall spacers 114 are made of silicon nitride, silicon oxide, other applicable materials, or a combination thereof. In some embodiments, the sidewall spacers 114 are formed by a deposition process (e.g., a chemical vapor deposition process) followed by an anisotropic etching process.

Afterwards, source/drain (S/D) structures 116 are formed over and/or in the semiconductor fin 100a, as shown in FIG. 1B in accordance with some embodiments. In some embodiments, portions of the semiconductor fin 100a adjacent to the dummy gate stacks 108 are recessed to form recesses, and a strained material is grown in the recesses by an epitaxial (epi) process to form the S/D structures 116. In addition, the lattice constant of the strained material may be different from the lattice constant of the semiconductor substrate 100. In some embodiments, the S/D structures 116 include Si, Ge, SiGe, InAs, InGaAs, InSb, GaAs, GaSb, InAlP, InP, other applicable materials, or a combination thereof.

Figure 1C:
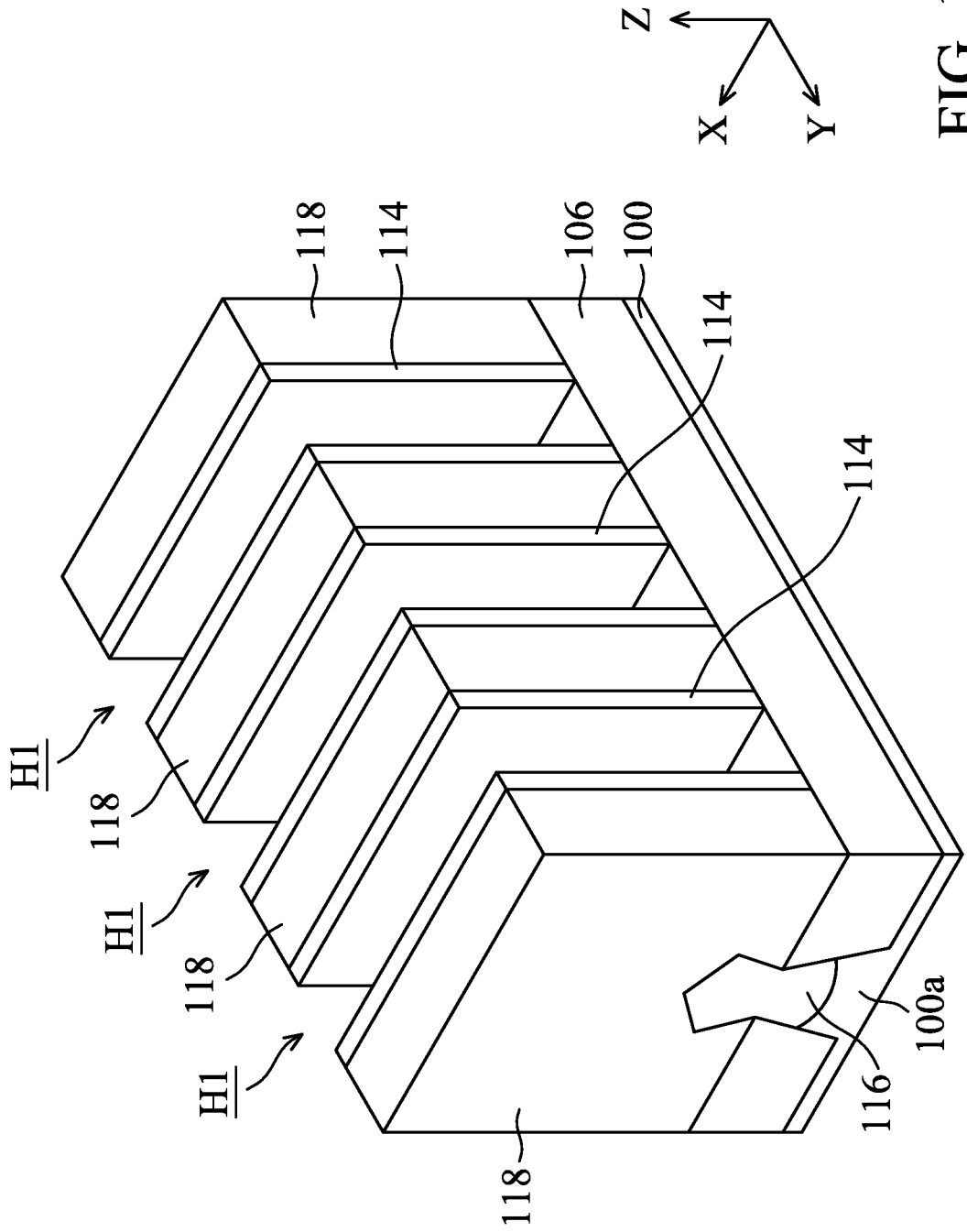

After the S/D structures 116 are formed, a dielectric layer (e.g., an interlayer dielectric layer) 118 is formed over the semiconductor substrate 100 and the semiconductor fin 100a, as shown in FIG. 1C in accordance with some embodiments. The dielectric layer 118 may cover and/or surround the source/drain structures 116, as shown in FIG. 1C.

For example, the dielectric layer 118 may be made of silicon oxide, silicon oxynitride, tetraethoxysilane, phosphosilicate glass (PSG), borophosphosilicate glass (BPSG), fluorosilicate glass (FSG), hydrogen silsesquioxane (HSQ), other applicable dielectric materials, or a combination thereof. For example, the dielectric layer 118 may be formed using a chemical vapor deposition process, a spin-on coating process, another applicable process, or a combination thereof.

Afterwards, the dummy gate stacks 108 are removed to form trenches (or recesses or openings) H1 in the dielectric layer 118, as shown in FIG. 1C in accordance with some embodiments. The trenches H1 may be formed using a dry etching process, a wet etching process, or a combination thereof.

Figure 1D:
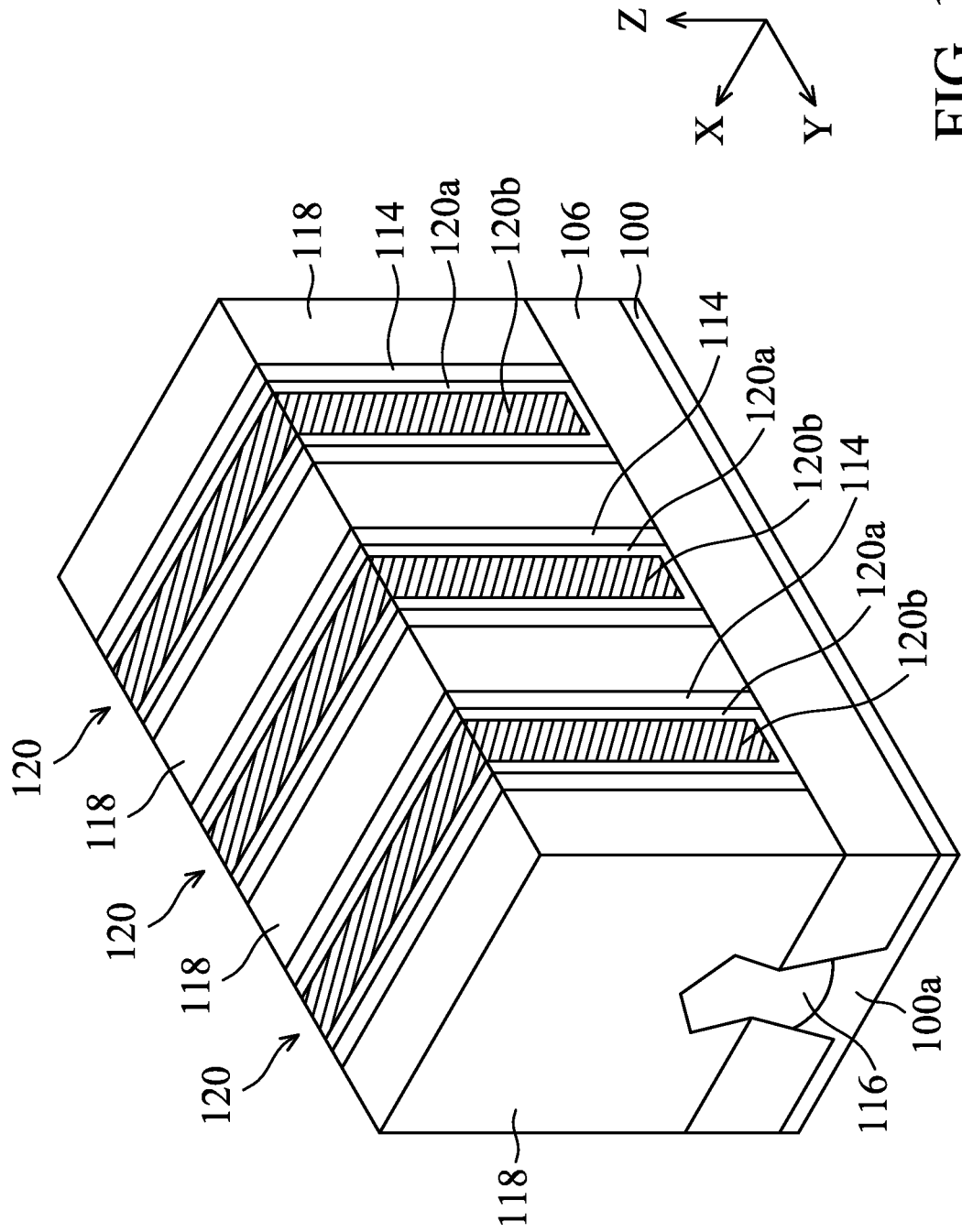

Afterwards, gate dielectric layers 120a are formed in the trenches H1, as shown in FIG. 1D in accordance with some embodiments. The gate dielectric layers 120a may conformally line the trenches H1, as shown in FIG. 1D. The gate dielectric layers 120a may be U-shaped, as shown in FIG. 1D.

In some embodiments, the gate dielectric layers 120a are made of silicon oxide. In some embodiments, the gate dielectric layers 120a are made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. The gate dielectric layers 120a may be formed using a chemical vapor deposition process, an atomic layer deposition process, another applicable process, or a combination thereof.

Afterwards, gate electrode layers 120b are formed on the gate dielectric layers 120a in the trenches H1, as shown in FIG. 1D in accordance with some embodiments. A gate electrode layer 120b combined with its corresponding gate dielectric layer 120a may be referred to as a gate stack 120 or a metal gate stack 120.

In some embodiments, each of the gate electrode layers 120b includes a work function layer conformally formed on the gate dielectric layer 120a. The work function layer may include metal, metal carbide, metal nitride, another applicable material, or a combination thereof. For example, the work function layer may include tantalum, tantalum nitride, titanium, titanium nitride, another applicable material, or a combination thereof. For example, the work function layer may be formed using a physical vapor deposition process, a chemical vapor deposition process, an atomic layer deposition process, another applicable deposition process, or a combination thereof.

In some embodiments, each of the gate electrode layers 120b includes a gate conductive fill material formed on the gate dielectric layer 120a. The gate conductive fill material may be formed on the work function layer, and the work function layer may be located between the gate dielectric layer 120a and the gate conductive fill material. The gate conductive material may be surrounded by the work function layer. For example, the gate conductive fill material may include copper, molybdenum, nickel, platinum, ruthenium, another applicable metal, or a combination thereof. For example, the gate conductive fill material may be formed by a physical vapor deposition process, a chemical vapor deposition process, an atomic layer deposition process, another applicable deposition process, or a combination thereof.

In some embodiments, a chemical mechanical polishing (CMP) process is performed to remove portions of the gate electrode layers 120b and the gate dielectric layers 120a that are outside the trenches H1, such that the top surfaces of the gate electrode layers 120b are level with the top surfaces of the gate dielectric layers 120a, the top surfaces of the sidewall spacers 114, and the top surface of the dielectric layer 118, as shown in FIG. 1D. The chemical mechanical polishing may also remove the top portion of the dielectric layer 118 and the top portions of the sidewall spacers 114.

Figure 1E:
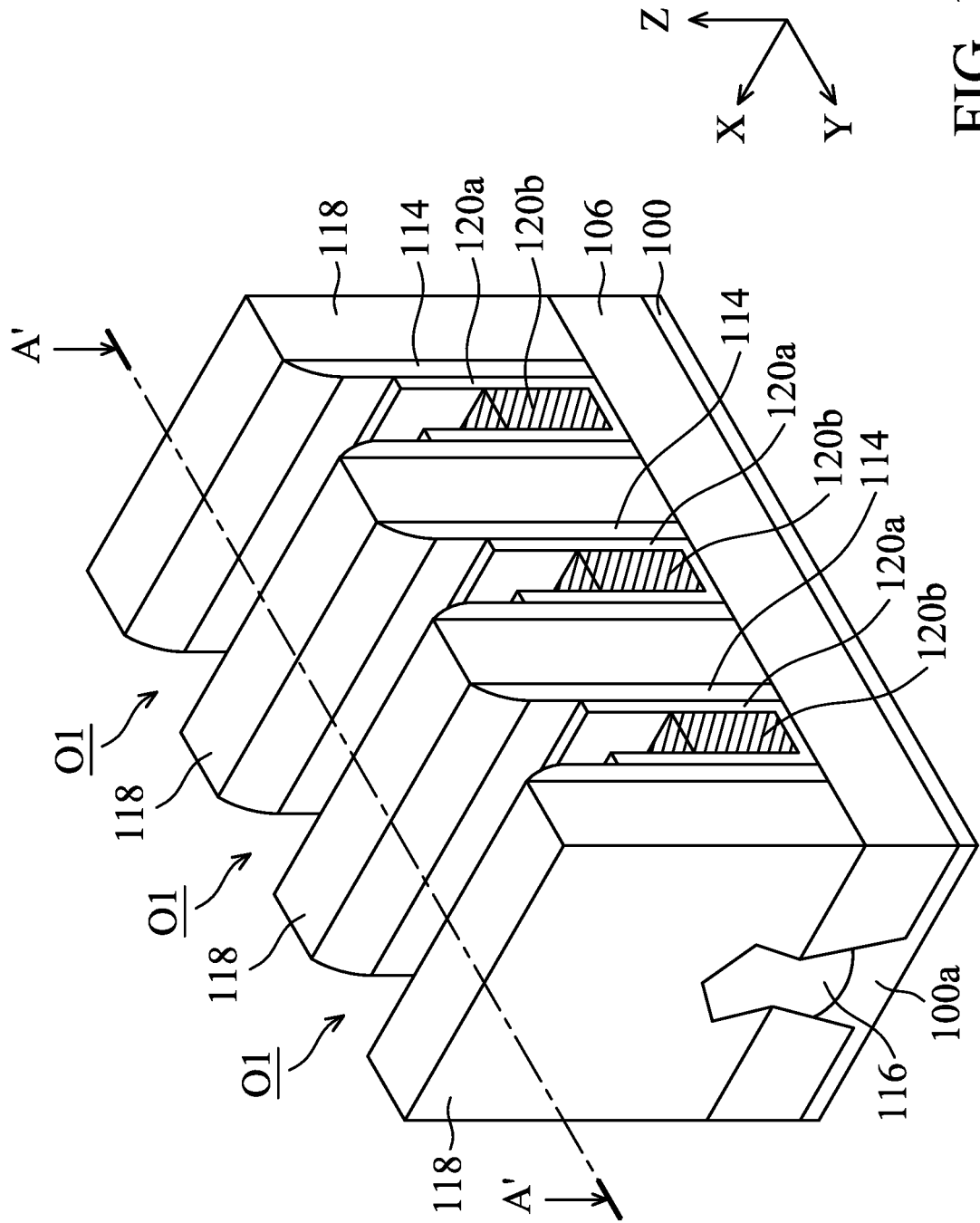
Figure 2A:
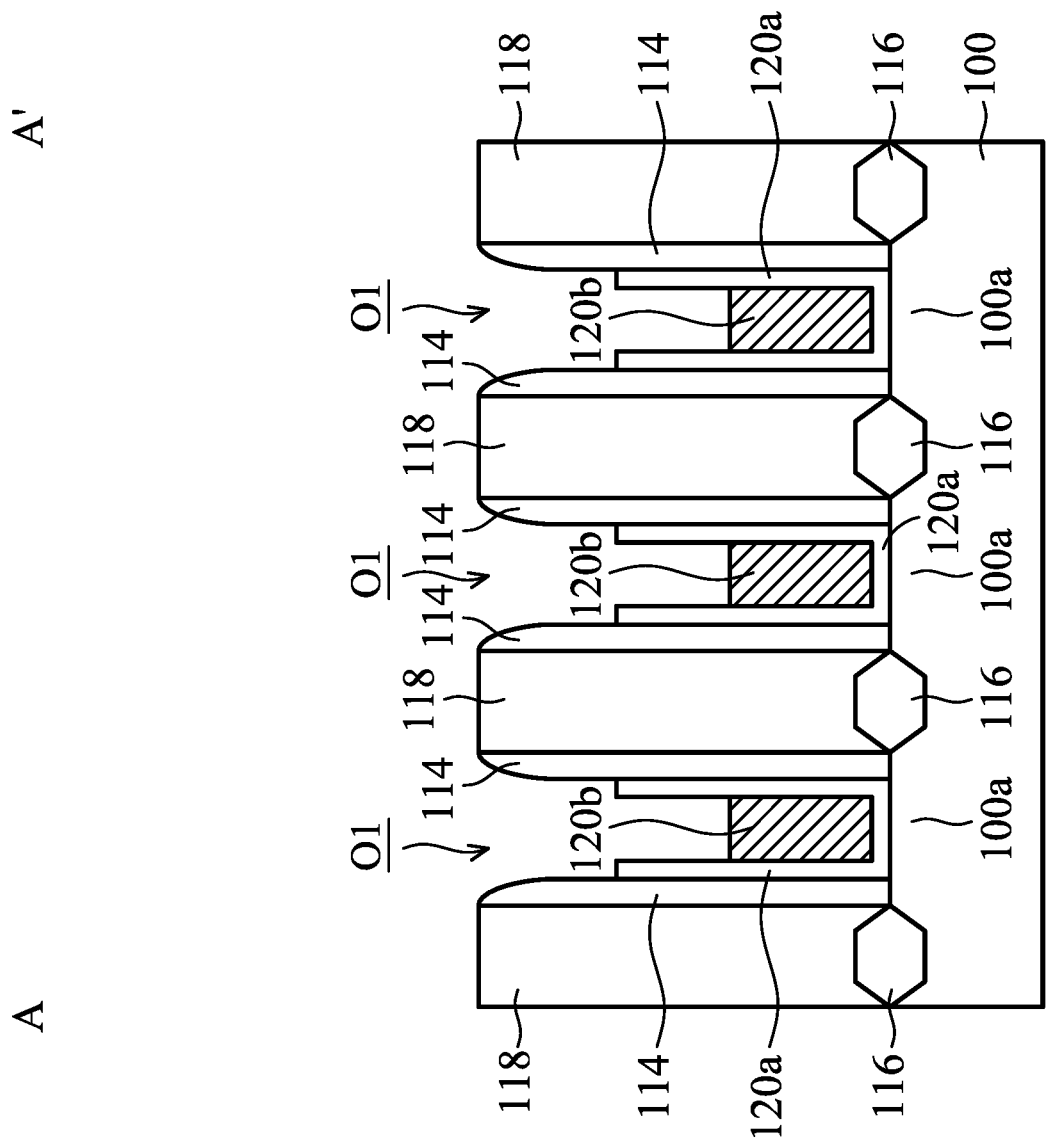
FIGS. 2A, 2B, 2C, 2D, 2E, 2F, 2G, 2H, 2I, 2J, 2K, 2L, 2M, 2N, 2O, and 2P are a series of cross-sectional views taken along line A-A' of FIG. 1E and illustrate various stages of a method for forming a semiconductor structure in accordance with some embodiments.

Afterwards, the gate stacks 120 are recessed to form trenches (or recesses or openings) O1 in the dielectric layer 118, as shown in FIGS. 1E and 2A in accordance with some embodiments. FIG. 2A illustrates a cross-sectional view taken along the line A-A' of FIG. 1E, and FIGS. 2B, 2C, 2D, 2E, 2F, 2G, 2H, 2I, 2J, 2K, 2L, 2M, 2N, 2O, and 2P are a series of cross-sectional views illustrating the steps following the step illustrated in FIG. 2A. The details of these steps will be discussed in the following paragraphs.

For example, the trenches O1 may be formed by using an etching process (e.g., a dry etching process, a wet etching process, or a combination thereof). In some embodiments, the etching process removes the top portions of the gate dielectric layers 120a, the top portions of the gate electrode layers 120b, and/or the top portions of the sidewall spacers 114, as shown in FIGS. 1E and 2A.

In some embodiments, in the etching process for forming the trenches O1, the etching rate of the gate electrode layers 120b is higher than the etching rate of the gate dielectric layers 120a, such that the top surfaces of the gate electrode layers 120b are lower than the top surfaces of the gate dielectric layers 120a after the etching process for forming the trenches O1.

In some embodiments, in the etching process for forming the trenches O1, the etching rate of the sidewall spacers 114 is lower than the etching rate of the gate dielectric layers 120a and the etching rate of the gate electrode layers 120b. The etching process for forming the trenches O1 may result in tapered top portions of the sidewall spacers 114, as shown in FIG. 1E and FIG. 2A.

In some embodiments, after the etching process for forming the trenches O1, top portions of the gate electrode layers 120b are converted into native oxide layers (not shown in the figures) due to, for example, the exposure to the atmosphere including oxygen.

Figure 2B:
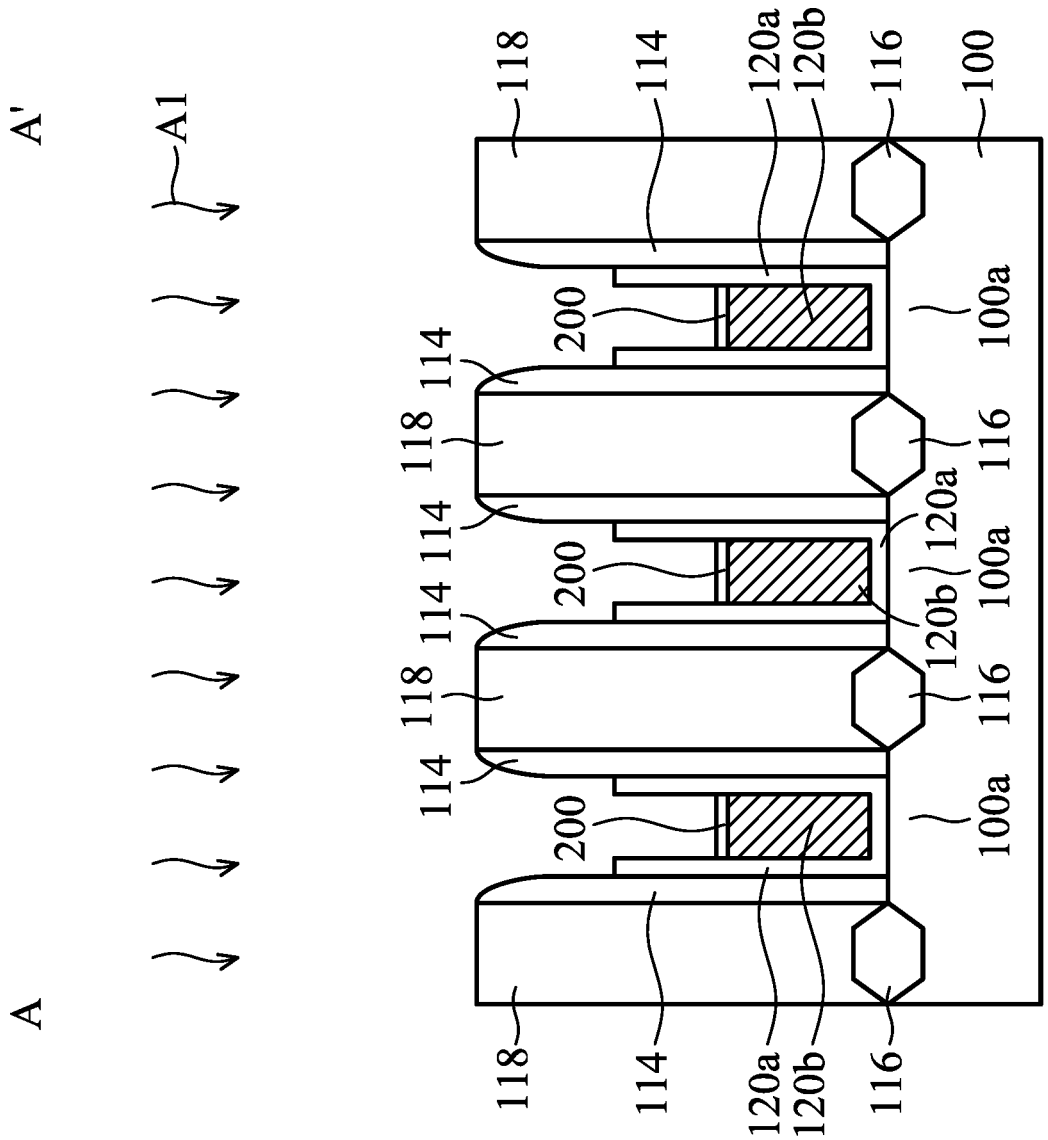

Afterwards, a surface treatment process A1 is performed to treat the top surfaces of the gate electrode layers 120b, so that oxide layers 200 are formed on the top surfaces of the gate electrode layers 120b, as shown in FIG. 2B in accordance with some embodiments.

In some embodiments, after the etching process for forming the trenches O1, the structure illustrated in FIG. 2A is transferred into a chamber, and the surface treatment process A1 is performed in the chamber to treat the top surfaces of the gate electrode layers 120b.

The surface treatment process A1 may include introducing an aluminum-containing gas into the chamber. Afterwards, the aluminum-containing gas may react with the native oxide layers of gate electrode layers 120b to form the oxide layers 200. In some embodiments, the oxide layers 200 include aluminum oxide. In some embodiments, the aluminum-containing gas reacts with the oxygen of the native oxide layers to form the oxide layers 200 on the top surfaces of the gate electrode layers 120b, so that the native oxide layers are reduced to metal state, lowering the gate resistance of the semiconductor structure.

For example, the aluminum-containing gas may include triethylaluminum (TEAL), dimethylaluminumhydride (DMAH), trimethylaluminum, dimethylethylamine alane, another applicable gas, or a combination thereof.

For example, during the surface treatment process A1, the aluminum-containing gas may be introduced into the chamber at a flow rate in a range from about 500 sccm to about 3000 sccm. For example, during the surface treatment process A1, the pressure in the chamber may be in a range from about 0.5 torr to about 5 torr. For example, during the surface treatment process A1, the temperature in the chamber may be in a range from about 250° C. to about 550° C. For example, the duration of the surface treatment process A1 may be in a range from about 30 seconds to about 120 seconds. These parameters (e.g., the duration) of the surface treatment process A1 may be adjusted to obtain an applicable thickness (e.g., in a range from about 5 Å to about 10 Å) of the oxide layers 200.

Figure 2C:
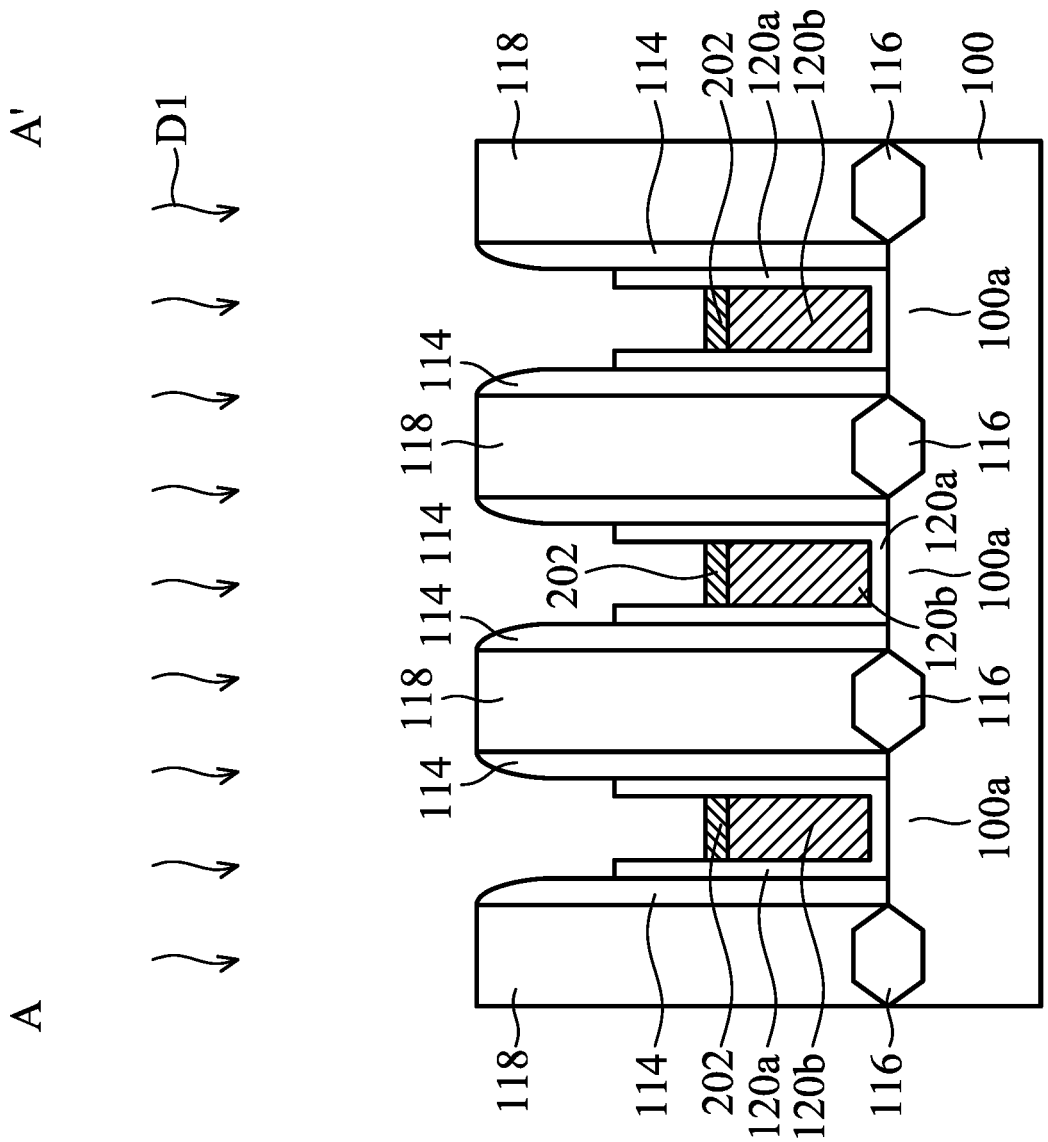

Afterwards, a deposition process D1 is performed to form metal cap layers 202 on the top surfaces of the gate electrode layers 120b, as shown in FIG. 2C in accordance with some embodiments. In some embodiments, the metal cap layers 202 and the underlying gate electrode layers 120b include different metals, so that the metal cap layers 202 can protect the underlying gate electrode layers 120b from damage during a subsequent process. The details will be discussed in the following paragraphs.

In some embodiments, the structure illustrated in FIG. 2B is transferred into a deposition chamber to perform the deposition process D1 for forming the metal cap layers 202. In some embodiments, the deposition process D1 includes a chemical vapor deposition process, an atomic layer deposition process, another applicable deposition process, or a combination thereof. In some embodiments, the oxide layers 200 are removed during the deposition process D1, as shown in FIG. 2C.

In some embodiments, the deposition process D1 includes introducing a chloride-containing precursor gas into the deposition chamber for the deposition of the metal of the metal cap layers 202. In some embodiments, the chloride-containing precursor gas is capable of removing the oxide layers 200. Therefore, in these embodiments, the oxide layers 200 are removed by the chloride-containing precursor gas during the deposition process D1 (e.g., at the beginning of the introduction of the chloride-containing precursor into the deposition chamber). In some embodiments, after the removal of the oxide layers 200, the chloride-containing precursor gas is continuously introduced into the deposition chamber to form the metal cap layers 202 on the top surfaces of the gate electrode layers 120b.

In some embodiments, the deposition process D1 includes selectively forming the metal cap layers 202 on the top surfaces of the gate electrode layers 120b by bottom-up growth. The metal cap layers 202 formed by bottom-up growth may have fewer defects (e.g., seams), which may improve the performance of the semiconductor structure.

In some embodiments, since the chloride-containing precursor gas used in forming the metal cap layers 202 can remove the oxide layers 200, no additional process (e.g., a process removing the oxide layers 200 by using a gas that is different from the chloride-containing precursor gas used in forming the metal cap layers 202) is necessary to remove the oxide layers 200. Therefore, in these embodiments, the oxygen content [O] at the interfaces between the metal cap layers 202 and the gate electrode layers 120b can be lowered in a cost-effective way. In some embodiments, since the oxygen content [O] at the interfaces between the metal cap layers 202 and the gate electrode layers 120b is lowered (e.g., in a range from about 0.1 at % to about 1 at %), the gate resistance of the semiconductor structure is lowered, improving the performance of the semiconductor structure.

In some embodiments, aluminum residues from the oxide layers 200 remain at the interfaces between the metal cap layers 202 and the gate electrode layers 120b. For example, the aluminum content [Al] at the interfaces between the metal cap layers 202 and the gate electrode layers 120b may be in a range from about 0.1 at % to about 3 at %.

In some embodiments, the chloride-containing precursor gas used in forming the metal cap layers 202 includes tungsten, and thus the metal cap layers 202 are made of tungsten. In some embodiments, the chloride-containing precursor gas includes $WCl_5$.

In some embodiments, chlorine residues from the chloride-containing precursor gas remain in the metal cap layers 202. For example, the chlorine content [Cl] of the metal cap layers 202 may be in a range from about 0.1 at % to about 1 at %. In some embodiments, the metal cap layers 202 include tungsten and chlorine.

For example, during the deposition process D1, the chloride-containing precursor gas may be introduced into the deposition chamber at a flow rate in a range from about 500 sccm to about 3000 sccm. For example, during the deposition process D1, the pressure in the deposition chamber may be in a range from about 15 torr to about 40 torr. For example, during the deposition process D1, the temperature in the deposition chamber may be in a range from about 300° C. to about 550° C. These parameters of the deposition process D1 may be adjusted to reduce the defects formed in the metal cap layers 202.

For example, when the deposition process D1 is an atomic layer deposition process, the number of the ALD cycles for forming the metal cap layers 202 may be in a range from about 300 to about 600. When the deposition process D1 is an atomic layer deposition process, the number of the ALD cycles of the deposition process D1 may be adjusted to obtain an applicable thickness (e.g., in a range from about 30 Å to about 50 Å) of the metal cap layers 202.

In some embodiments, the chloride-containing precursor gas includes $WCl_5$, $TaCl_5$, $MoCl_5$, or a combination thereof. Therefore, in these embodiments, the metal cap layers 202 are made of W, Ta, Mo, or a combination thereof. In addition, in these embodiments, the metal cap layers 202 may also include Cl residues.

In some embodiments, the chloride-containing precursor gas is substantially free from fluorine, and thus the metal cap layers 202 are also substantially free from fluorine.

Figure 2D:
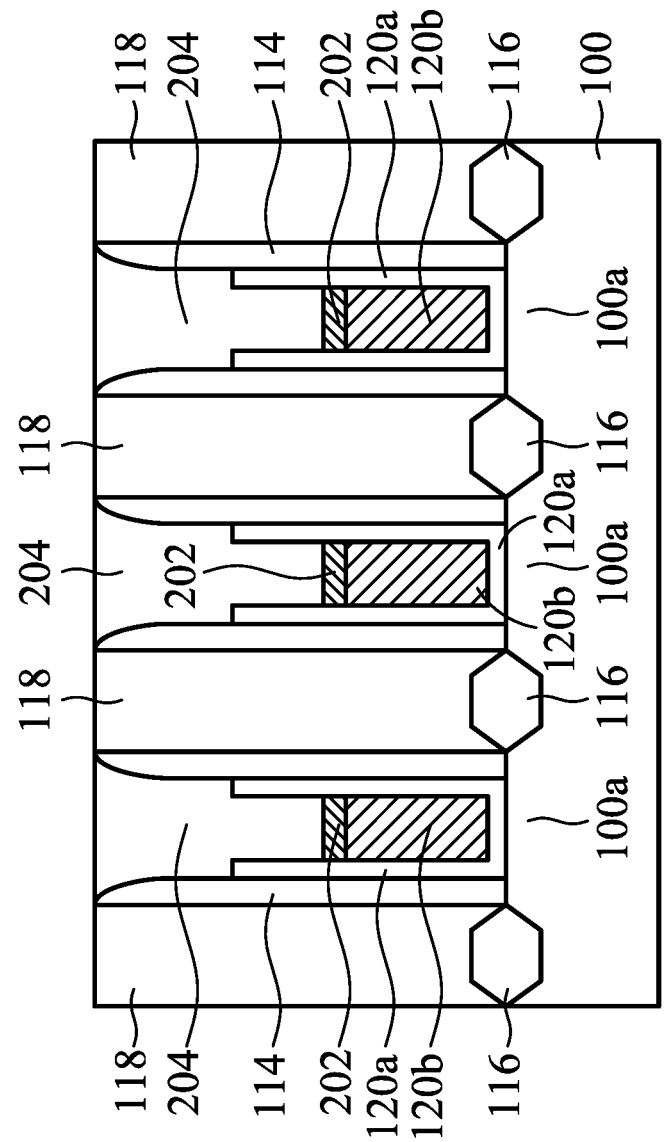

Afterwards, mask layers 204 are formed on the metal cap layers 202, as shown in FIG. 2D in accordance with some embodiments. The mask layers 204 may be T-shaped, as shown in FIG. 2D. In some embodiments, the mask layers 204 include ZrO, HfZrO, HfAlO, HfLaO, HfTiO, another applicable material, or a combination thereof. In some embodiments, the mask layers 204 include SiN, SiCN, SiOCN, other low K materials, or a combination thereof.

For example, the mask layers 204 may be formed using a chemical vapor deposition process, an atomic layer deposition process, another applicable process, or a combination thereof. A chemical mechanical polishing process may be performed on the mask layers 204, such that top surfaces of the mask layers 204 may be level with the top surface of the dielectric layer 118, as shown in FIG. 2D.

Figure 2E:
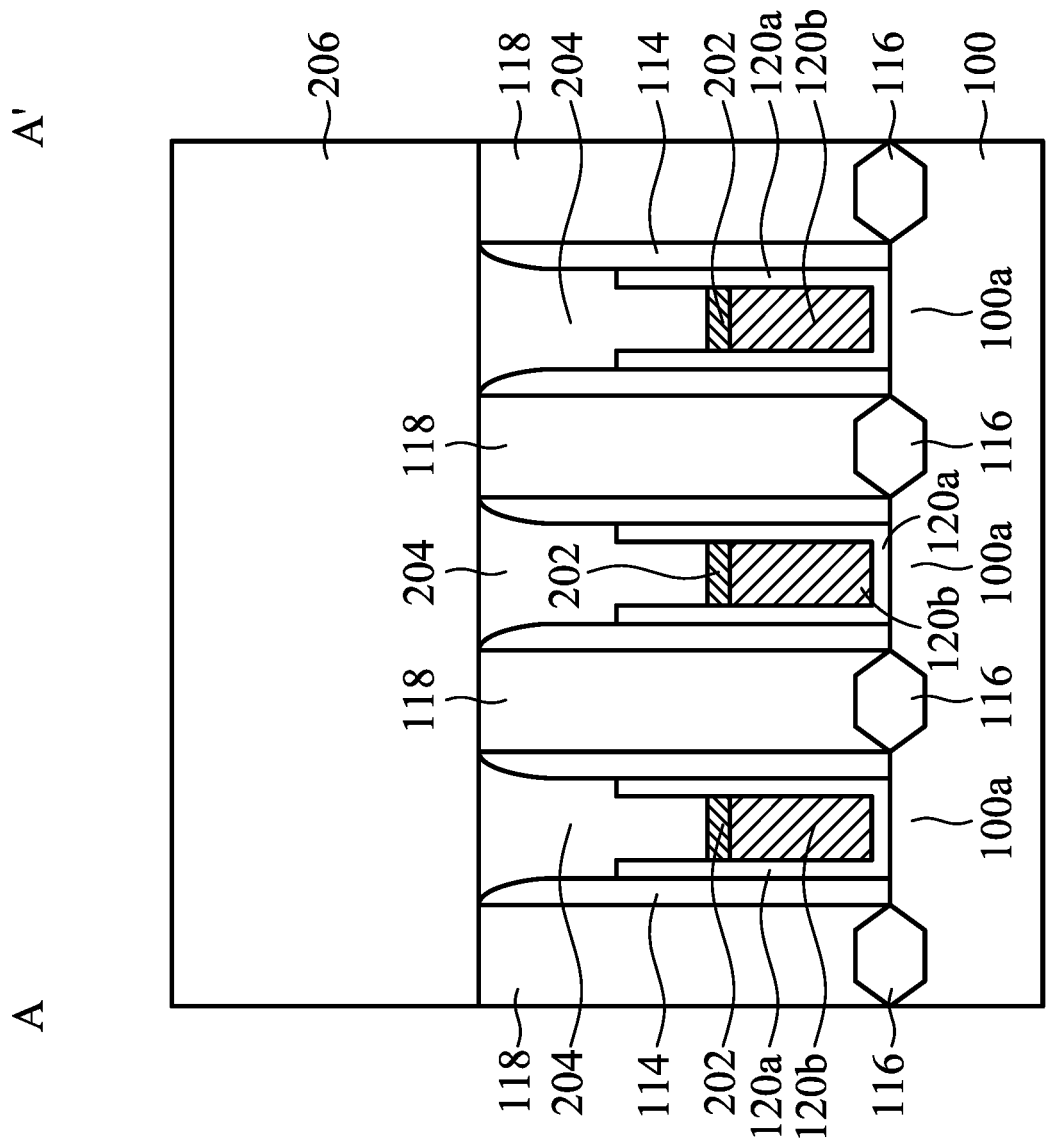

Afterwards, a dielectric layer 206 is formed on the dielectric layer 118 and the mask layers 204, as shown in FIG. 2E in accordance with some embodiments. For example, the dielectric layer 206 may be made of silicon oxide, silicon oxynitride, tetraethoxysilane, phosphosilicate glass (PSG), borophosphosilicate glass (BPSG), fluorosilicate glass (FSG), hydrogen silsesquioxane (HSQ), other applicable dielectric materials, or a combination thereof. For example, the dielectric layer 206 may be formed using a chemical vapor deposition process, a spin-on coating process, another applicable process, or a combination thereof.

Figure 2F:
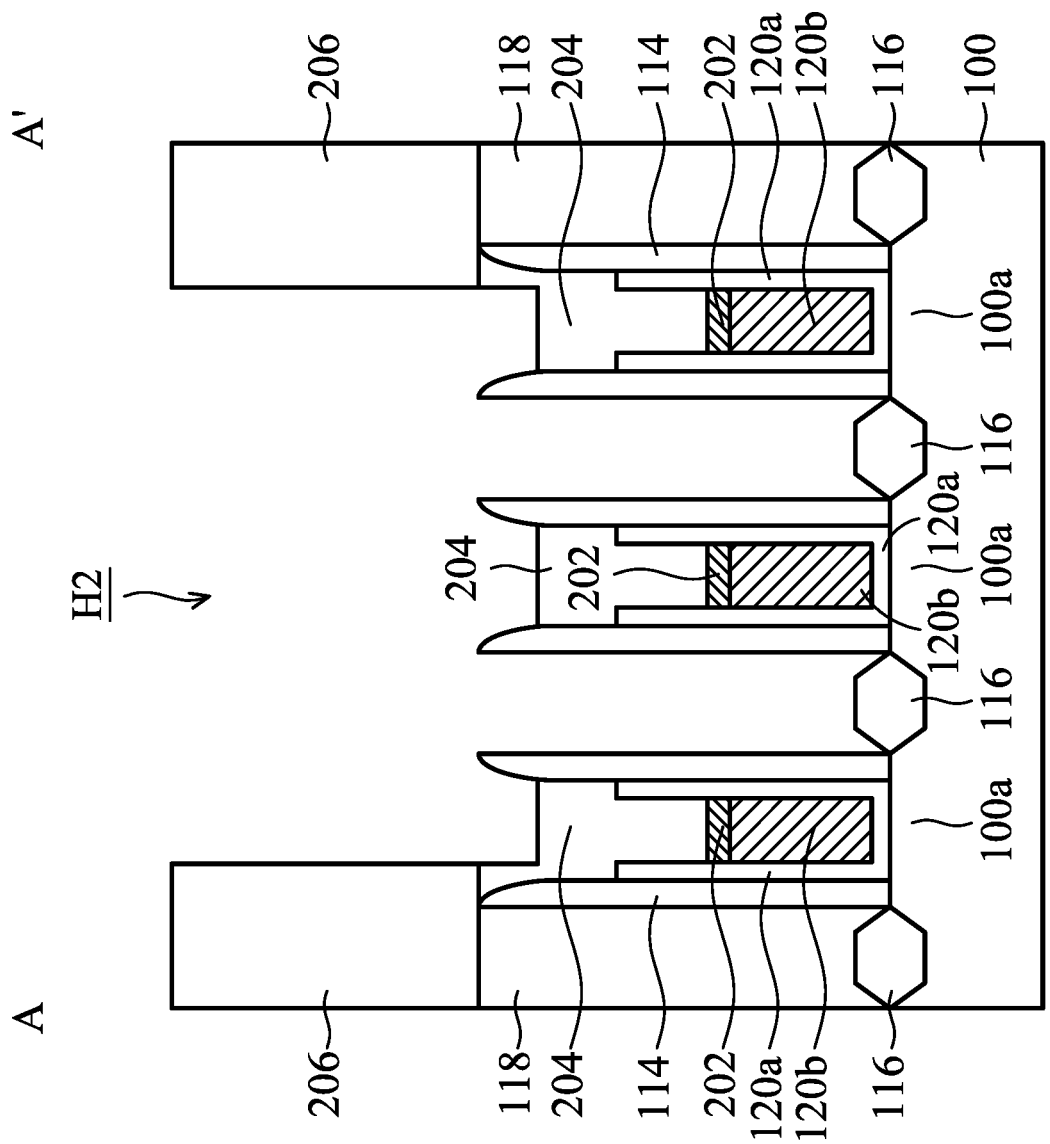

Afterwards, a trench H2 is formed to expose at least one of the S/D structures 116, as shown in FIG. 2F in accordance with some embodiments. In some embodiments, the trench H2 penetrates through the dielectric layer 206 and the dielectric layer 118 to expose the S/D structure(s) 116, as shown in FIG. 2F.

The trench H2 may be formed using a patterning process. The patterning process may remove portions of the dielectric layer 206 and the dielectric layer 118 to expose the S/D structure(s) 116. The patterning process may also remove the top portions of the mask layers 204, as shown in FIG. 2F. For example, the patterning process may include a photolithography process, an etching process, another applicable process, or a combination thereof. In some embodiments, in the etching process of the patterning process for forming the trench H2, the etching rate of the dielectric layer 206 is higher than the etching rate of the mask layers 204.

Figure 2G:
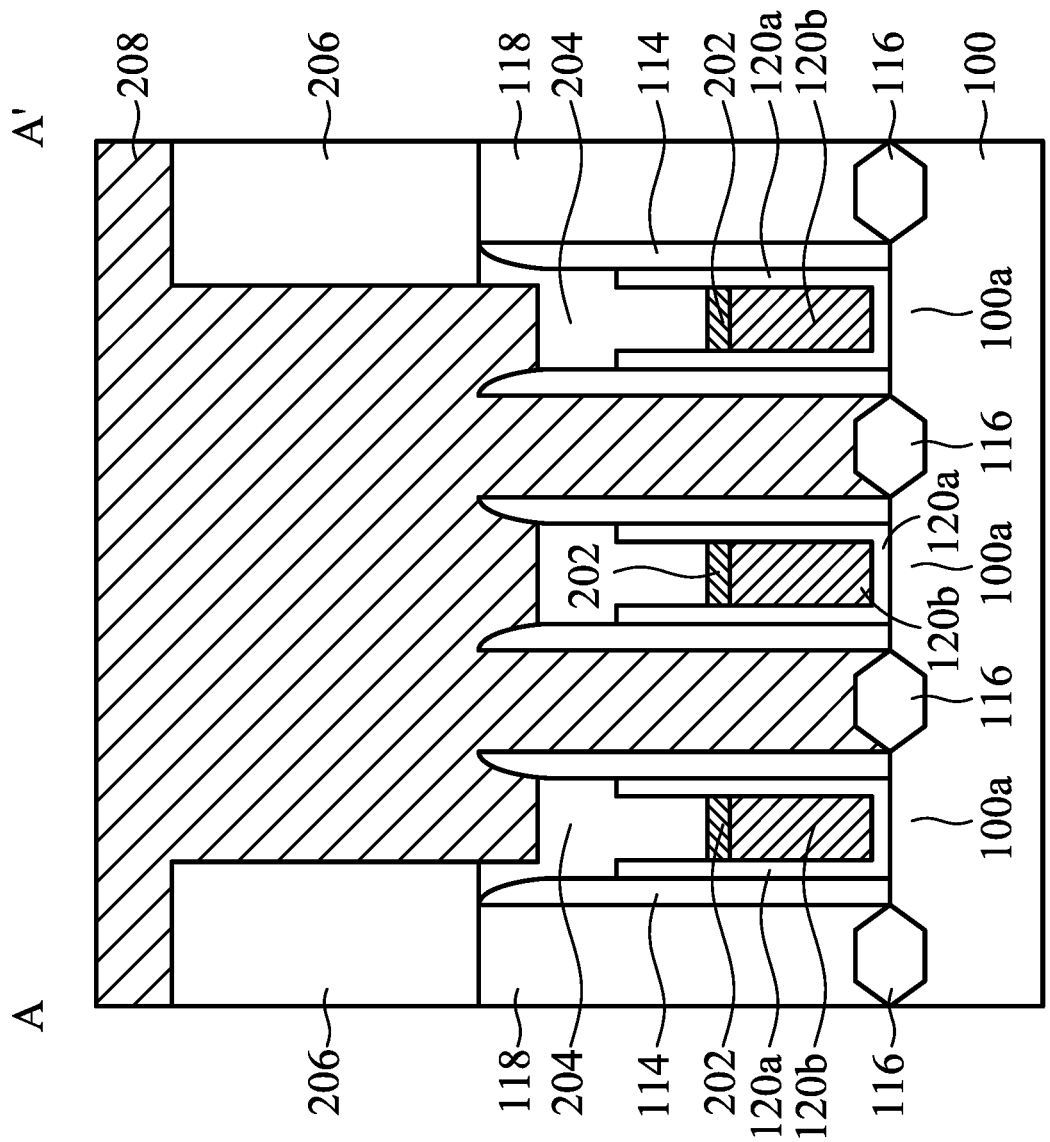

Afterwards, the trench H2 is filled with a conductive material 208, as shown in FIG. 2G in accordance with some embodiments. For example, the conductive material 208 may be formed using a physical vapor deposition process, an atomic layer deposition process, a plating process, another applicable process, or a combination thereof.

In some embodiments, the conductive material 208 includes a metal that is different from the metal of the gate electrode layers 120b. In some embodiments, the conductive material 208 includes cobalt. In some embodiments, the conductive material 208 includes titanium, aluminum, copper, tantalum, platinum, molybdenum, silver, manganese, zirconium, ruthenium, another applicable conductive material, or a combination thereof.

In some embodiments, before the formation of the conductive material 208, silicide layers (not shown in the figures) are formed on the S/D structure(s) 116 exposed through the trench H2. The silicide layers may be formed by reacting upper portions of the S/D structure(s) 116 exposed through the trench H2 with metal layers formed on these S/D structure(s) 116. An annealing process may be performed to facilitate the reaction of these S/D structures 116 with these metal layers.

Figure 2H:
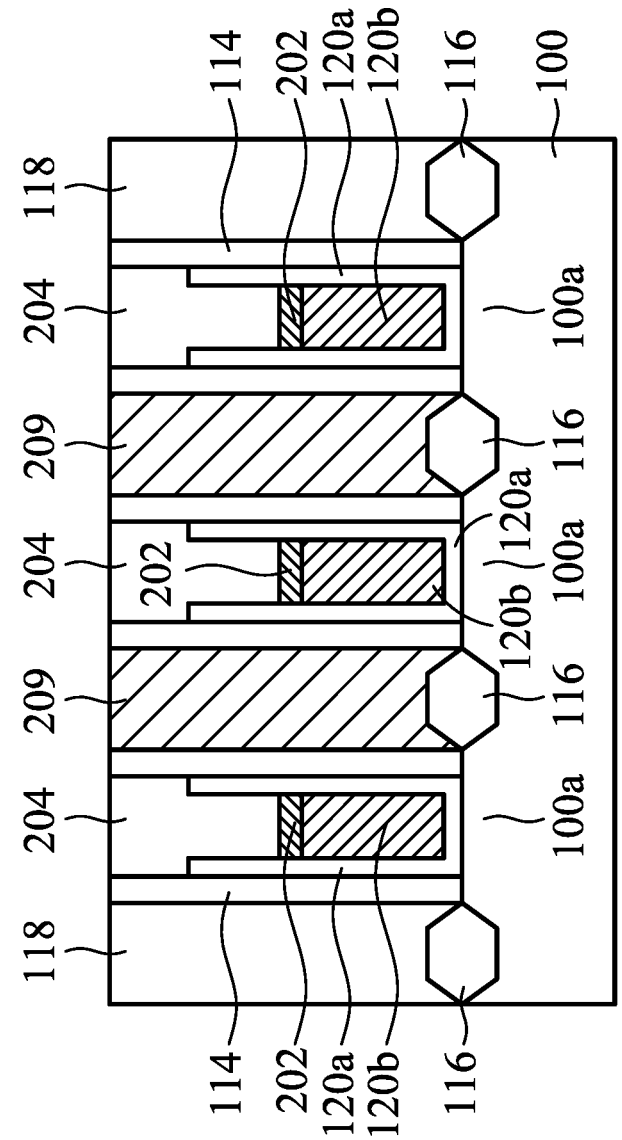

Afterwards, the top portion of the conductive material 208 is removed, as shown in FIG. 2H in accordance with some embodiments. In some embodiments, after the top portion of the conductive material 208 is removed, the lower portion of the conductive material 208 remain on the S/D structure(s) 116 to serve as contact structure(s) 209, as shown in FIG. 2H. The contact structure(s) 209 may be electrically connected to the S/D structure(s) 116.

In some embodiments, a planarization process (e.g., a chemical mechanical polishing process) is performed to remove the top portion of the conductive material 208. In some embodiments, the planarization process removes the top portion of the conductive material 208, the dielectric layer 206, the top portion of the dielectric layer 118, the top portions of the sidewall spacers 114, and the top portions of the mask layers 204. In these embodiments, after the planarization process, the top surface(s) of the contact structure(s) 209 is level with the top surface of the dielectric layer 118, the top surfaces of the mask layers 204, and the top surfaces of the sidewall spacers 114.

Figure 2I:
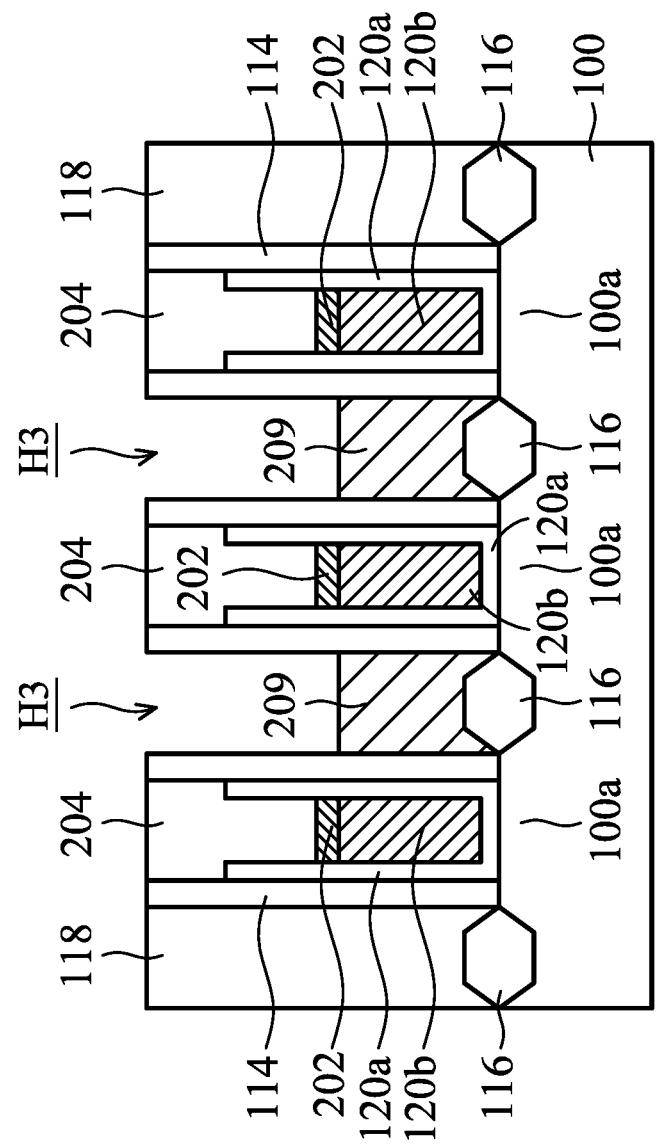

Afterwards, the top portion of the contact structure 209 is removed to form a trench (or recess or opening) H3, as shown in FIG. 2I in accordance with some embodiments. In some embodiments, the contact structure 209 is recessed by an etching process (e.g., a dry etching process, a wet etching process, or a combination thereof) to form the trench 113.

Figure 2J:
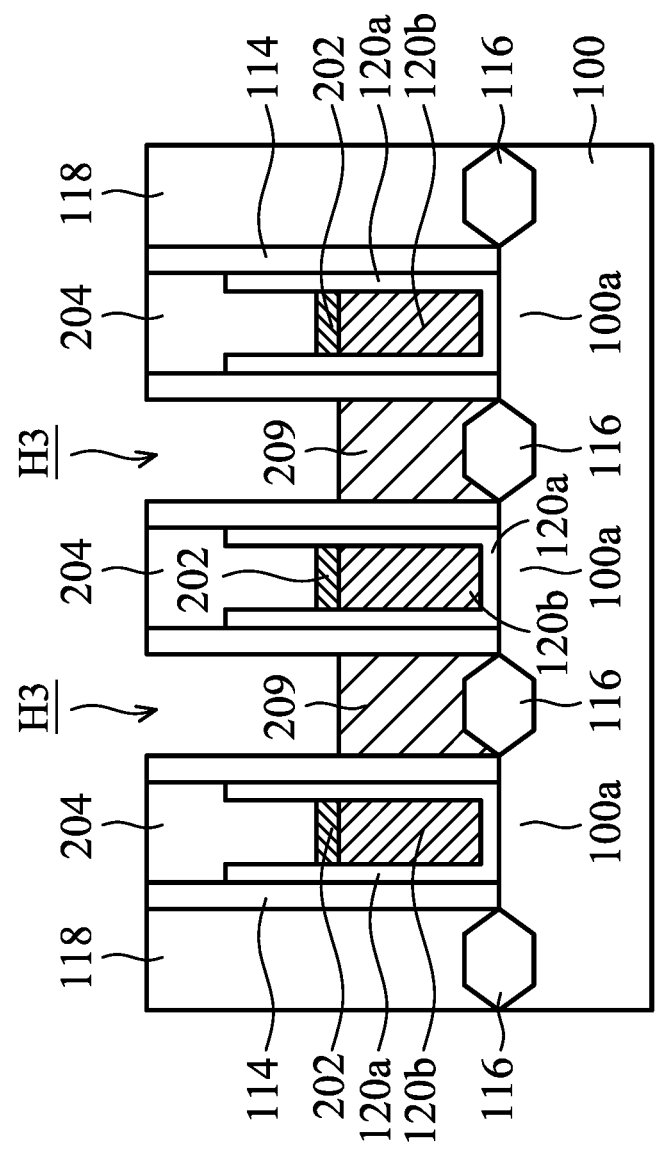

Afterwards, a surface treatment process A2 is performed to treat the top surface of the contact structure 209 to remove the native oxide layer (not shown in the figure) of the contact structure 209, as shown in FIG. 2J in accordance with some embodiments.

In some embodiments, after the etching process for forming the trench(es) H3, the structure illustrated in FIG. 2I is transferred into a chamber, and the surface treatment process A2 is performed in the chamber to treat the top surface(s) of the contact structure(s) 209.

The surface treatment process A2 may include introducing a treatment gas into the chamber. Afterwards, the native oxide layer may be removed from the contact structure 209 by the reaction between the treatment gas and the native oxide layer. In some embodiments, the treatment gas includes hydrogen gas ($H_2$).

For example, during the surface treatment process A2, the treatment gas may be introduced into the chamber at a flow rate in a range from about 1500 sccm to about 5000 sccm. For example, during the surface treatment process A2, the pressure in the chamber may be in a range from about 3 torr to about 5 torr. For example, during the surface treatment process A2, the temperature in the chamber may be in a range from about 400° C. to about 550° C. For example, the duration of the surface treatment process A2 may be in a range from about 60 seconds to about 360 seconds. These parameters of the surface treatment process A2 may be adjusted to modify the surface properties of the contact structure(s) 209.

In some embodiments, the treatment gas used in the surface treatment process A2 is substantially free from chlorine, so that the contact structure(s) 209 is not damaged during the surface treatment process A2.

Figure 2K:
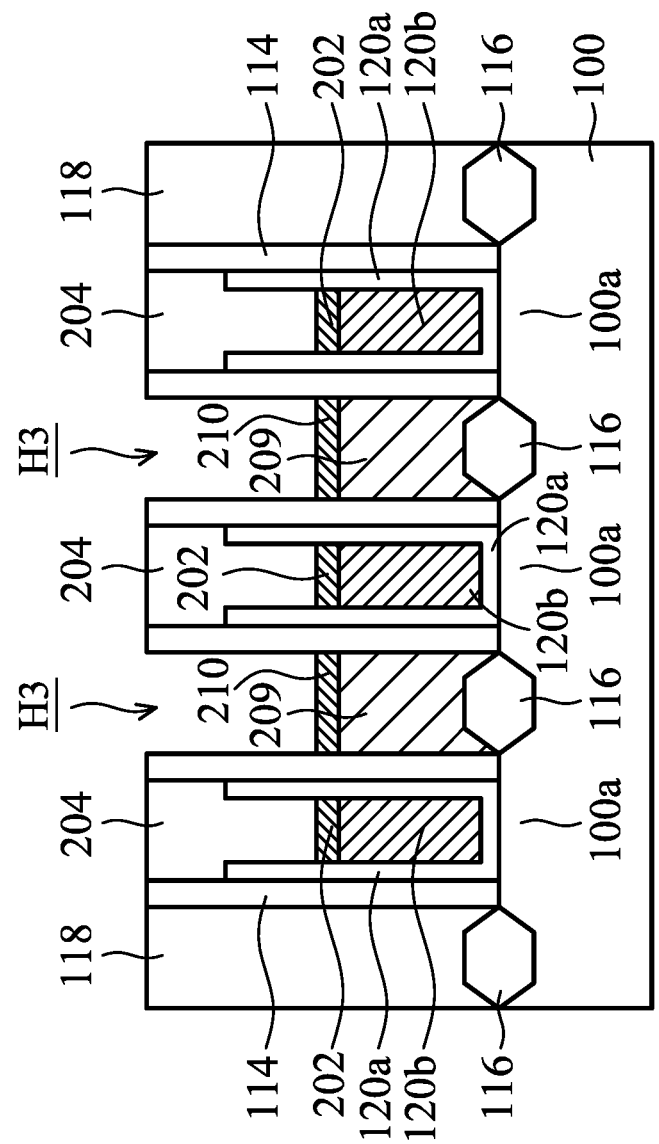

Afterwards, a deposition process D2 is performed to form a metal cap layer 210 on the top surface of the contact structure 209, as shown in FIG. 2K in accordance with some embodiments. In some embodiments, the metal cap layer 210 and the underlying contact structure 209 include different metals, so that the metal cap layer 210 can protect the underlying contact structure 209 from damage during a subsequent process. The details will be discussed in the following paragraphs.

In some embodiments, the deposition process D2 and the surface treatment process A2 are performed in the same chamber. In some embodiments, the deposition process D2 and the surface treatment process A2 are performed in-situ. In some embodiments, the deposition process D2 includes a chemical vapor deposition process, an atomic layer deposition process, another applicable deposition process, or a combination thereof.

In some embodiments, the deposition process D2 includes introducing a fluoride-containing precursor gas into the deposition chamber for the deposition of the metal of the metal cap layer(s) 210. In some embodiments, the deposition process D2 includes selectively forming the metal cap layers 210 on the top surfaces of the contact structures 209 by bottom-up growth. The metal cap layers 210 formed by bottom-up growth may have fewer defects (e.g., seams), which may improve the performance of the semiconductor structure.

In some embodiments, the fluoride-containing precursor gas used in forming the metal cap layers 210 includes tungsten, and thus the metal cap layers 210 are made of tungsten. In some embodiments, the fluoride-containing precursor gas includes $WF_6$.

In some embodiments, fluorine residues from the fluoride-containing precursor gas remain in the metal cap layers 210. For example, the fluorine content [F] of the metal cap layers 210 may be in a range from about 0.1 at % to about 3 at %. In some embodiments, the metal cap layers 210 include tungsten and fluorine.

For example, during the deposition process D2, the fluoride-containing precursor gas may be introduced into the deposition chamber at a flow rate in a range from about 500 sccm to about 3000 sccm. For example, during the deposition process D2, the pressure in the deposition chamber may be in a range from about 2 torr to about 10 torr. For example, during the deposition process D2, the temperature in the deposition chamber may be in a range from about 250° C.
to about 300° C. These parameters of the deposition process D2 may be adjusted to reduce the defects formed in the metal cap layers 210.

For example, the duration of the deposition process D2 may be in a range from about 100 seconds to about 400 seconds. The duration of the deposition process D2 may be adjusted to obtain an applicable thickness (e.g., in a range from about 30 Å to about 50 Å) of the metal cap layers 210.

In some embodiments, the chloride-containing precursor gas (e.g., $WCl_5$) of the deposition process D1 and the fluoride-containing precursor gas (e.g., $WF_6$) of the deposition process D2 include the same metal, and thus the metal cap layer 202 and the metal cap 210 include the same metal. In some embodiments, the metal cap layer 202 and the metal cap layer 210 both include tungsten.

In some embodiments, the deposition process D2 is a chemical vapor deposition process, and the fluoride-containing precursor gas (e.g., $WF_6$) and hydrogen gas are introduced into the deposition chamber. The fluoride-containing precursor gas may react with the hydrogen gas to form the metal cap layers 210.

In some embodiments, the fluoride-containing precursor gas is substantially free from chlorine, and thus the metal cap layers 210 are also substantially free from chlorine.

In some embodiments, the chloride-containing precursor gas used in the deposition process D1 is used in the deposition process D2 to form the metal cap layers 210, and the chloride-containing precursor gas may damage the contact structures 209 (e.g., contact structures made of cobalt) during the deposition process D2. In some embodiments, since the deposition process D2 uses the fluoride-containing precursor gas (e.g., $WF_6$), rather than the chloride-containing precursor gas (e.g., $WCl_5$), to form the metal cap layers 210 on the contact structures 209, the contact structures 209 are not substantially damaged during the deposition process D2.

In some embodiments, since the surface treatment process A2 is performed to remove the native oxide layers of the contact structures 209 before the formation of the metal cap layers 210, the oxygen content [O] at the interfaces between the metal cap layers 210 and the contact structures 209 can be lowered. In some embodiments, since the oxygen content [O] at the interfaces between the metal cap layers 210 and the contact structures 209 is lowered (e.g., in a range from about 0.1 at % to about 1 at %), the contact resistance of the semiconductor structure is lowered, improving the performance of the semiconductor structure.

Figure 2L:
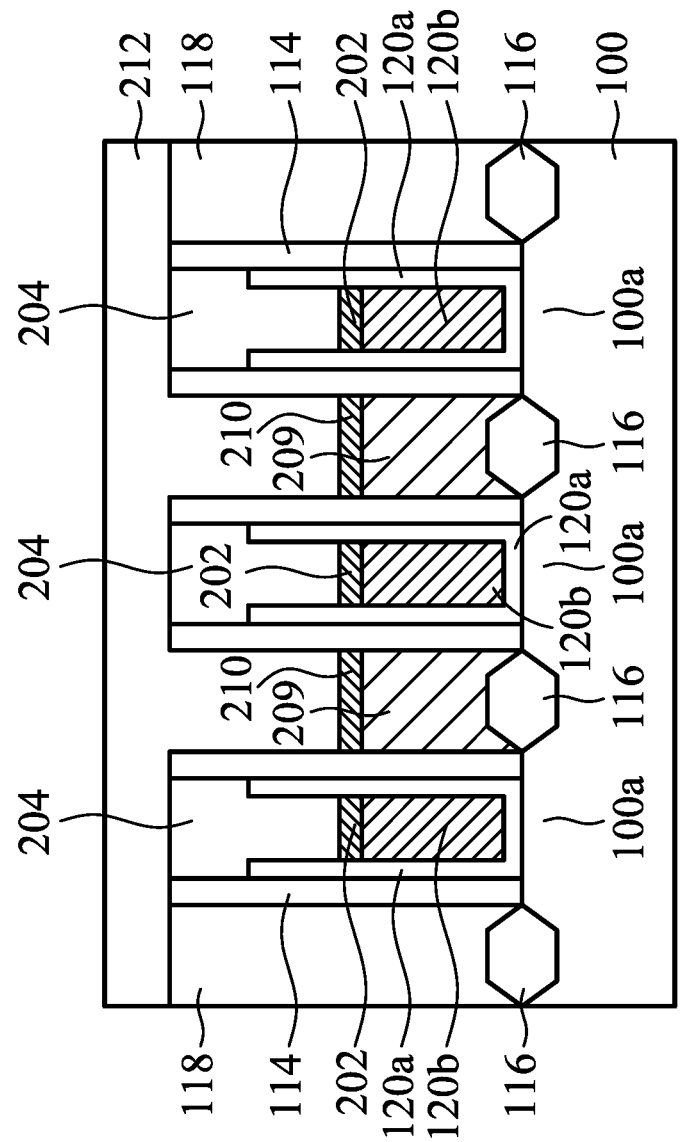

Afterwards, a mask layer 212 is formed on the metal cap layers 210, as shown in FIG. 2L, in accordance with some embodiments. In some embodiments, the mask layer 212 extends from the top surface of the dielectric layer 118 into the trenches H3, as shown in FIG. 2L. In some embodiments, the remaining portions of the trenches H3 are filled with the mask layer 212.

In some embodiments, the mask layer 212 includes ZrO, HfZrO, HfAlO, HfLaO, HfTiO, another applicable material, or a combination thereof. In some embodiments, the mask layer 212 includes SiN, SiCN, SiOCN, other low K materials, or a combination thereof. For example, the mask layer 212 may be formed using a chemical vapor deposition process, an atomic layer deposition process, another applicable process, or a combination thereof.

In some embodiments, the mask layer 212 and the mask layer 204 are include different materials (e.g., one of the mask layer 212 and the mask layer 204 includes ZrO, HfZrO, HfAlO, HfLaO, HfTiO, or a combination thereof, and the other one of the mask layer 212 and the mask layer 204 includes SiN, SiCN, SiOCN, other low K materials, or a combination thereof).

Figure 2M:
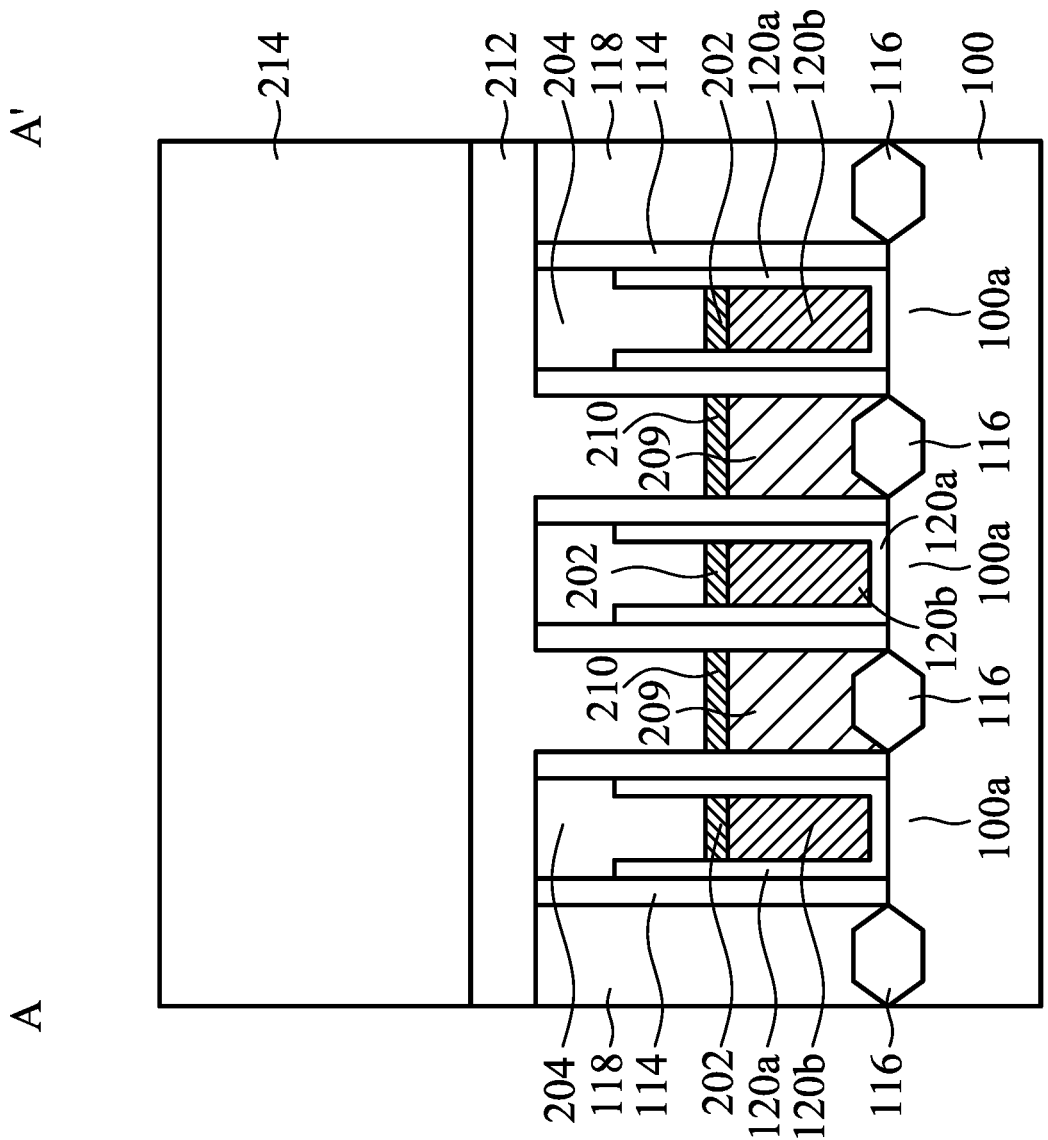

Afterwards, a dielectric layer 214 is formed on the mask layer 212, as shown in FIG. 2M in accordance with some embodiments. For example, the dielectric layer 214 may be made of silicon oxide, silicon oxynitride, tetraethoxysilane, phosphosilicate glass (PSG), borophosphosilicate glass (BPSG), fluorosilicate glass (FSG), hydrogen silsesquioxane (HSQ), other applicable dielectric materials, or a combination thereof. For example, the dielectric layer 214 may be formed using a chemical vapor deposition process, a spin-on coating process, another applicable process, or a combination thereof.

Figure 2N:
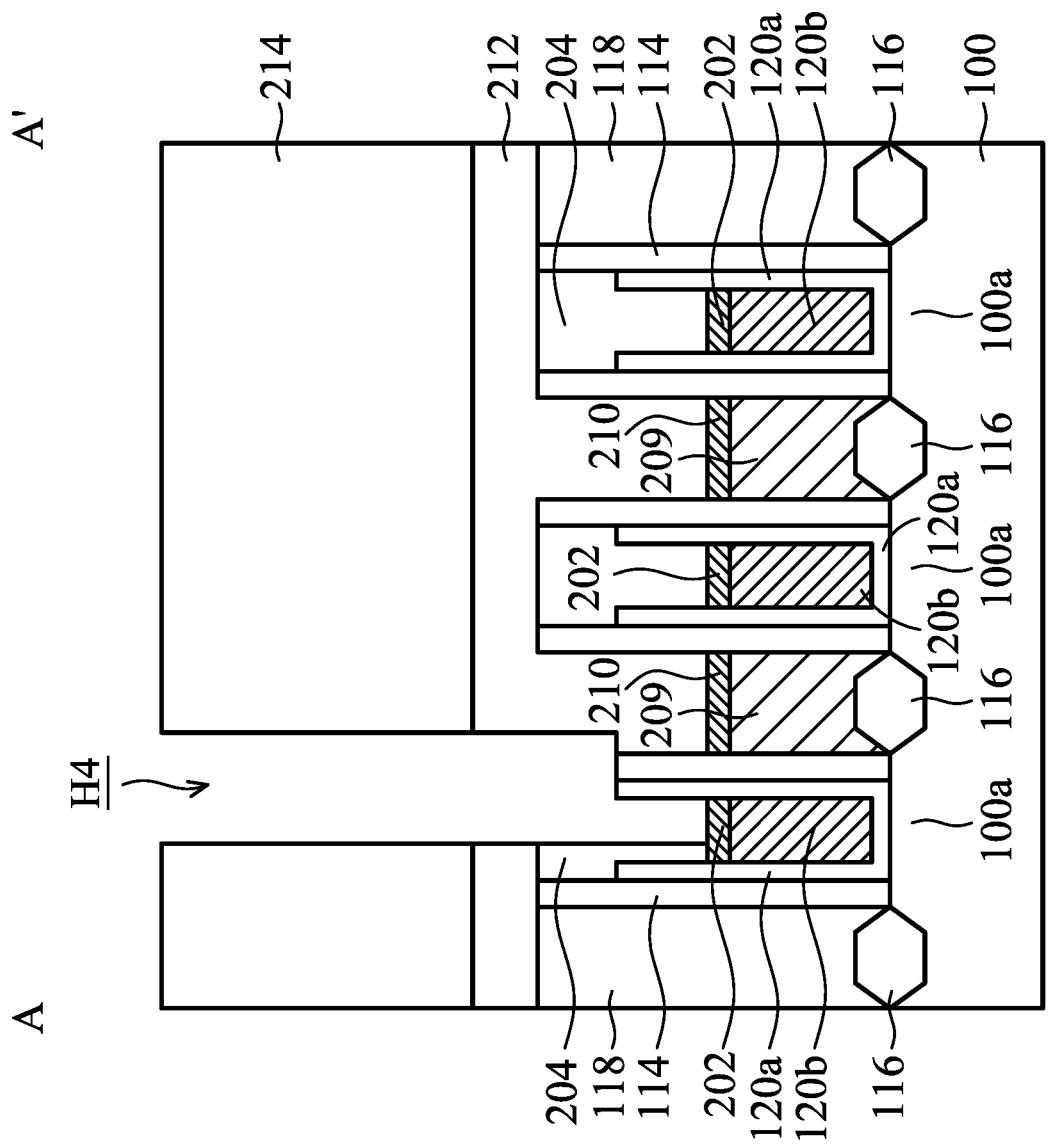

Afterwards, a trench H4 is formed to expose at least one metal cap layer 202, as shown in FIG. 2N in accordance with some embodiments. The trench H4 may penetrate through the dielectric layer 214, the mask layer 212 and the mask layer 204, as shown in FIG. 2N.

In some embodiments, the trench H4 is formed by an etching process (e.g., a dry etching process, a wet etching process, or a combination thereof). The etching process for forming the trench H4 may include one or more etching steps that use different etchants. In some embodiments, the top portion of the mask layer 212 serves as an etch stop layer in the etching step of the etching process for forming the trench 114 in the dielectric layer 214.

In some embodiments, in the etching step of the etching process for forming the trench 114 in the mask layer 204, the etching rate of the mask layer 204 is higher than the etching rate of the metal cap layer 202. In some embodiments, the etching selectivity between the mask layer 204 and the metal cap layer 202 in the etching step of the etching process for forming the trench 114 in the mask layer 204 is high enough, so that the metal cap layer 202 is not substantially damaged during the etching step of the etching process for forming the trench H4 in the mask layer 204. In some embodiments, since the etching selectivity between the mask layer 204 and the metal cap layer 202 in the etching step of the etching process for forming the trench 114 in the mask layer 204 is high enough, the metal cap layer 202 can protect the underlying gate electrode layer 120b from being damaged during the etching step of the etching process for forming the trench H4 in the mask layer 204, thus reducing the gate resistance of the semiconductor structure. For example, the etching selectivity between the mask layer 204 and the metal cap layer 202 in the etching step of the etching process for forming the trench 114 in the mask layer 204 may be in a range from about 10:1 to about 20:1. In some embodiments, the metal cap layer 202 serves as the etch stop layer in the etching step of the etching process for forming the trench H4 in the mask layer 204.

In some embodiments, in the etching step of the etching process for forming the trench H4 in the mask layer 204, the etching rate of the mask layer 204 is higher than the etching rate of the mask layer 212. In some embodiments, the etching selectivity between the mask layer 204 and the mask layer 212 in the etching step of the etching process for forming the trench 114 in the mask layer 204 is high enough, so that the etching step of the etching process for forming the trench H4 in the mask layer 204 is a self-aligned etching step. The etching selectivity between the mask layer 204 and the mask layer 212 in the etching step of the etching process for forming the trench H4 in the mask layer 204 may be in a range from about 10:1 to about 30:1.

Figure 2O:
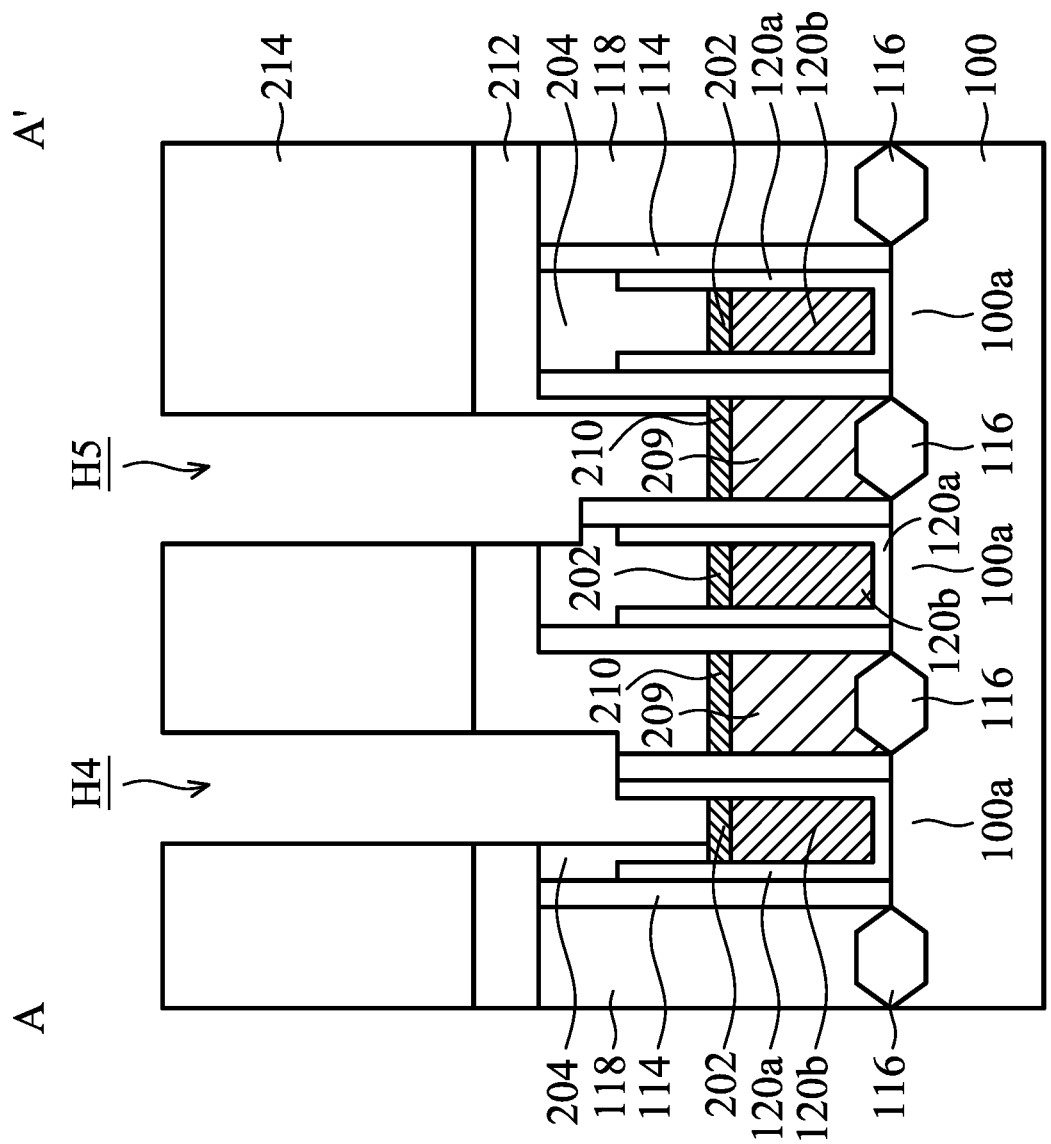

Afterwards, a trench 115 is formed to expose at least one metal cap layer 210, as shown in FIG. 2O in accordance with some embodiments. The trench H5 may penetrate through the dielectric layer 214 and the mask layer 212, as shown in FIG. 2O.

In some embodiments, the trench H5 is formed by an etching process (e.g., a dry etching process, a wet etching process, or a combination thereof). The etching process for forming the trench 115 may include one or more etching steps that use different etchants. In some embodiments, the top portion of the mask layer 212 serves as an etch stop layer in the etching step of the etching process for forming the trench 115 in the dielectric layer 214.

In some embodiments, in the etching step of the etching process for forming the trench H5 in the mask layer 212, the etching rate of the mask layer 212 is higher than the etching rate of the metal cap layer 210. In some embodiments, the etching selectivity between the mask layer 212 and the metal cap layer 210 in the etching step of the etching process for forming the trench H5 in the mask layer 212 is high enough, so that the metal cap layer 210 is not substantially damaged during the etching step of the etching process for forming the trench H5 in the mask layer 212. In some embodiments, since the etching selectivity between the mask layer 212 and the metal cap layer 210 in the etching step of the etching process for forming the trench 1-15 in the mask layer 212 is high enough, the metal cap layer 210 can protect the underlying contact structure 209 from being damaged during the etching step of the etching process for forming the trench H5 in the mask layer 212, thus reducing the contact resistance of the semiconductor structure. For example, the etching selectivity between the mask layer 212 and the metal cap layer 210 in the etching step of the etching process for forming the trench H5 in the mask layer 212 may be in a range from about 10:1 to about 20:1. In some embodiments, the metal cap layer 210 serves as the etch stop layer in the etching step of the etching process for forming the trench H5 in the mask layer 212.

In some embodiments, in the etching step of the etching process for forming the trench H5 in the mask layer 212, the etching rate of the mask layer 212 is higher than the etching rate of the mask layer 204. In some embodiments, the etching selectivity between the mask layer 212 and the mask layer 204 in the etching step of the etching process for forming the trench 1-15 in the mask layer 212 is high enough, so that the etching step of the etching process for forming the trench H5 in the mask layer 212 is a self-aligned etching step. The etching selectivity between the mask layer 212 and the mask layer 204 in the etching step of the etching process for forming the trench H5 in the mask layer 212 may be in a range from about 10:1 to about 30:1.

Afterwards, a surface treatment process may be performed to treat the top surface of the metal cap layer 202 exposed through the trench H4 and the top surface of the metal cap layer 210 exposed through the trench H5. The surface treatment process may remove the native oxide layer of the metal cap layer 202 exposed through the trench H4 and the native oxide layer of the metal cap layer 210 exposed through the trench H5. In some embodiments, after the etching process for forming the trenches 114 and 115, the structure illustrated in FIG. 2O is transferred into a chamber, and the surface treatment process is performed in the chamber.

The surface treatment process may include introducing a treatment gas into the chamber to remove the native oxide layers. For example, the treatment gas may include a chloride-containing gas (e.g., $WCl_5$).

Figure 2P:
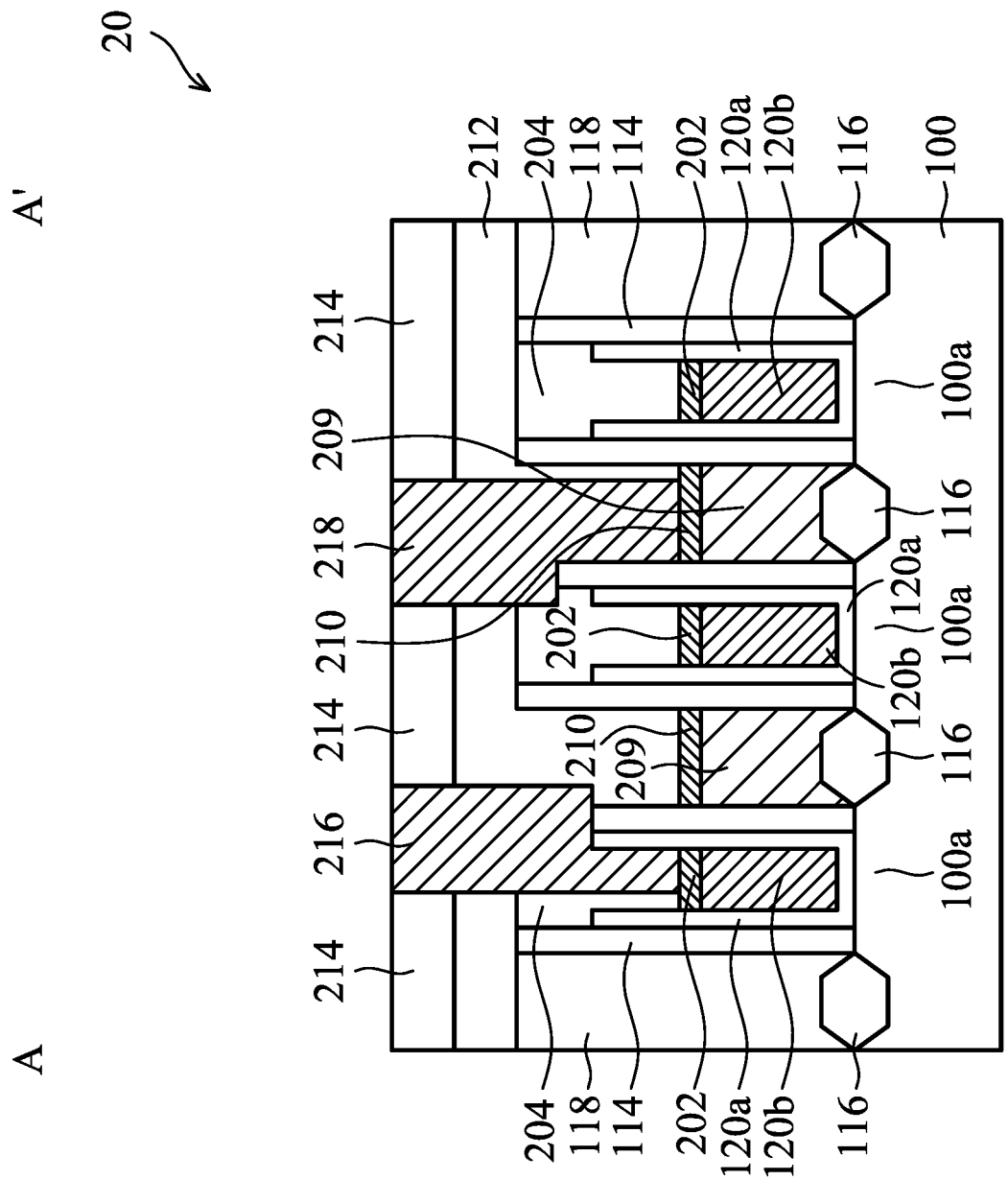

Afterwards, a conductive structure (e.g., a conductive via) 216 and a conductive structure 218 (e.g., a conductive via)

are respectively formed in the trench 114 and the trench 115, so as to form a semiconductor structure 20, as shown in FIG. 2P in accordance with some embodiments.

The conductive structure 216 and the conductive structure 218 may be formed using a deposition process (e.g., a chemical vapor deposition process, an atomic layer deposition process, a physical vapor deposition process, another applicable process, or a combination thereof). The deposition process may be performed in a deposition chamber, and the deposition process may include introducing a precursor gas (e.g., $C_5H_5(CO)_2Co$, $Ru_3(CO)_{12}$, $H_2$, another applicable precursor gas, or a combination thereof) into the deposition chamber. For example, during the deposition process, the pressure in the deposition chamber may be in a range from about 5 torr to about 15 torr. For example, during the deposition process, the temperature in the deposition chamber may be in a range from about 150° C. to about 300° C. These parameters of the deposition process may be adjusted to reduce the defects formed in the conductive structures 216 and 218.

For example, the duration of the deposition process may be in a range from about 300 seconds to about 1500 seconds. The duration of the deposition process may be adjusted to obtain an applicable thickness (e.g., in a range from about 300 Å to about 1500 Å) of the conductive structures 216 and 218.

In some embodiments, the deposition process for forming the conductive structures 216 and 218 and the surface treatment process for treating the metal cap layers 202 and 210 are performed in the same chamber. In some embodiments, the deposition process for forming the conductive structures 216 and 218 and the surface treatment process for treating the metal cap layers 202 and 210 are performed in-situ.

In some embodiments, the conductive structures 216 and 218 are formed by bottom-up growth. The conductive structures 216 and 218 formed by bottom-up growth may have fewer defects (e.g., seams), which may improve the performance of the semiconductor structure 20.

The conductive structures 216 and 218 may be formed by the same deposition process and thus they include the same metal. For example, the conductive structures 216 and 218 are made of Ru, Co, Mo, W, another applicable metal, or a combination thereof.

In some embodiments, the conductive structures 216 and 218 are made of Ru, and the precursor gas of the deposition process for forming the conductive structures 216 and 218 includes $Ru_3(CO)_{12}$, $Ru(CO)_5$, $C_{10}H_{10}Ru$, $Ru(CO)_3C_6H_8$, $Ru(CO)_2(tmhd)_2$, $Ru(CO)_2(acac)_2$, $Ru(C_6H_6)(C_6H_8)$, $Ru(acac)_3$, $RuO_4$, $Ru(EtCp)_2$, $RuCpPy$, Ru Carbonyl diketone derivatives, Ru cyclopentadienyl derivatives, or a combination thereof.

In some embodiments, a chemical mechanical polishing process is performed after the deposition process for forming the conductive structures 216 and 218. After the chemical mechanical polishing process, the top surfaces of the conductive structures 216 and 218 may be level with the top surface of the dielectric layer 214, as shown in FIG. 2P.

Figure 3:
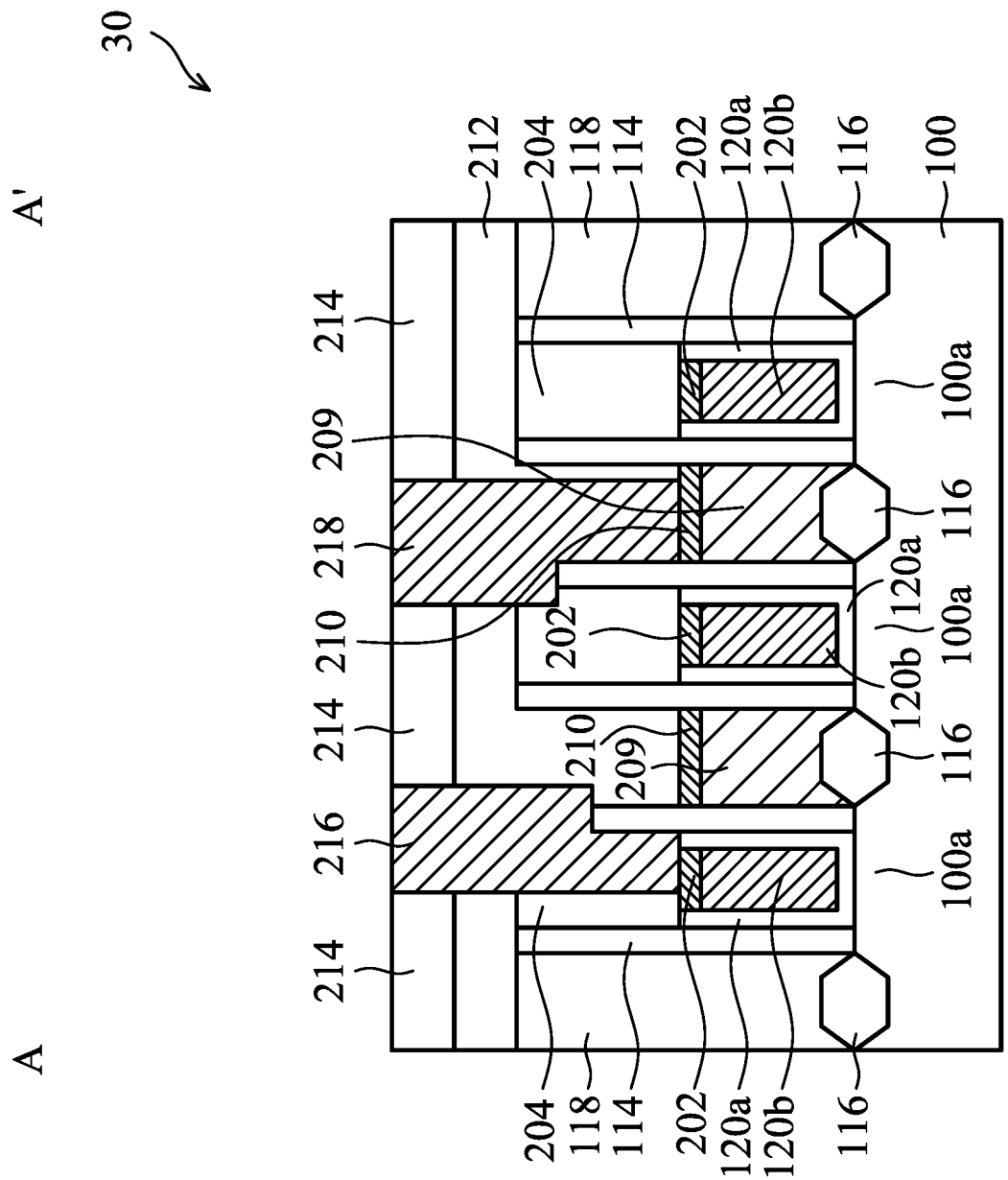
FIG. 3 illustrates a cross-sectional view of a semiconductor structure in accordance with some embodiments.

FIG. 3 illustrates a cross-sectional view of a semiconductor structure 30 in accordance with some embodiments. One difference between the semiconductor structure 30 and the semiconductor structure 20 is that the top surface of the metal cap layer 202 of the semiconductor structure 30 is level with the top surface of the gate dielectric layer 120a.

Figure 4:
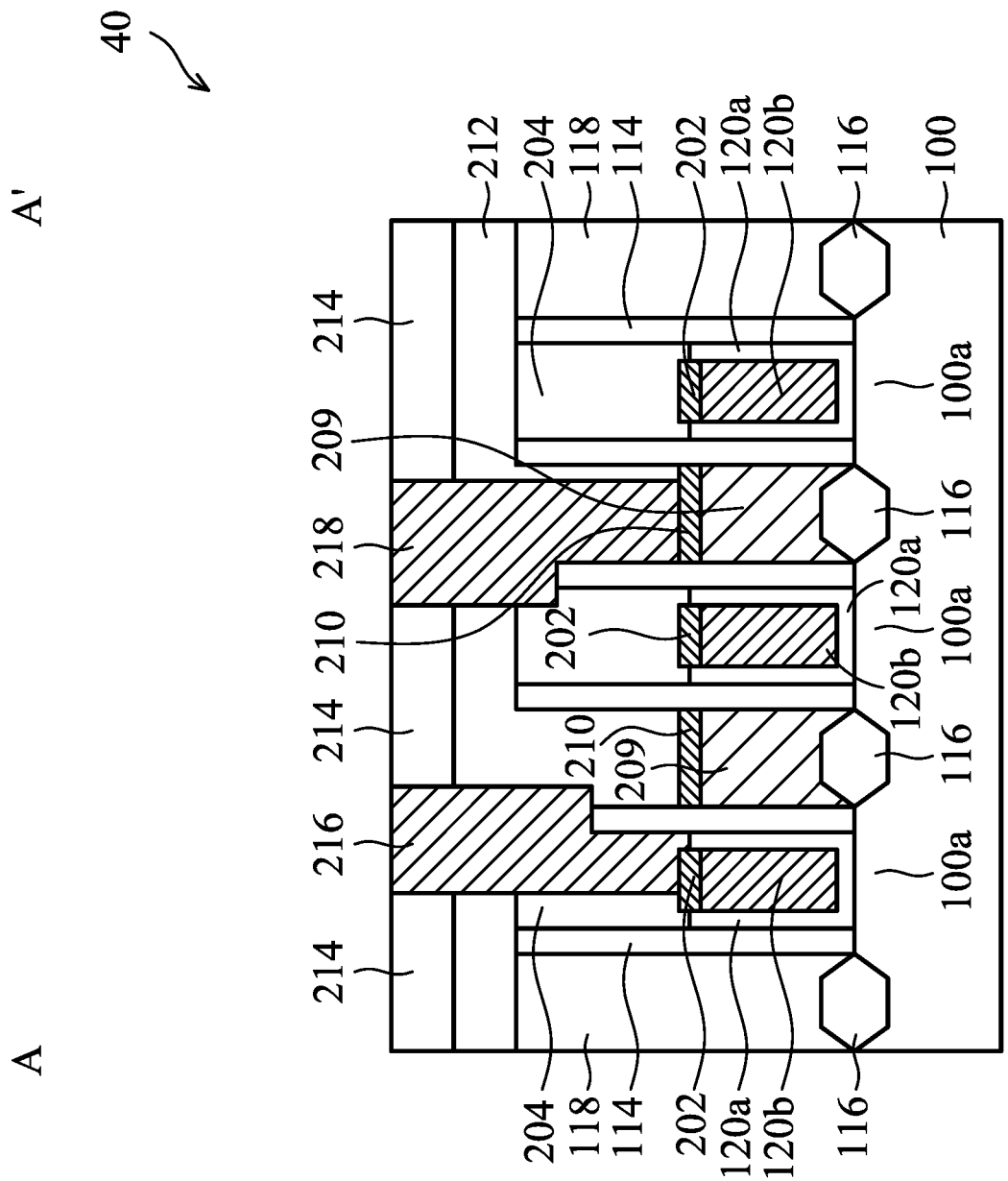
FIG. 4 illustrates a cross-sectional view of a semiconductor structure in accordance with some embodiments.

FIG. 4 illustrates a cross-sectional view of a semiconductor structure 40 in accordance with some embodiments. One difference between the semiconductor structure 40 and the semiconductor structure 20 is that the top surface of the gate dielectric layer 120a is at a level between the top surface of the metal cap layer 202 and the bottom surface of the metal cap layer 202.

Figure 5:
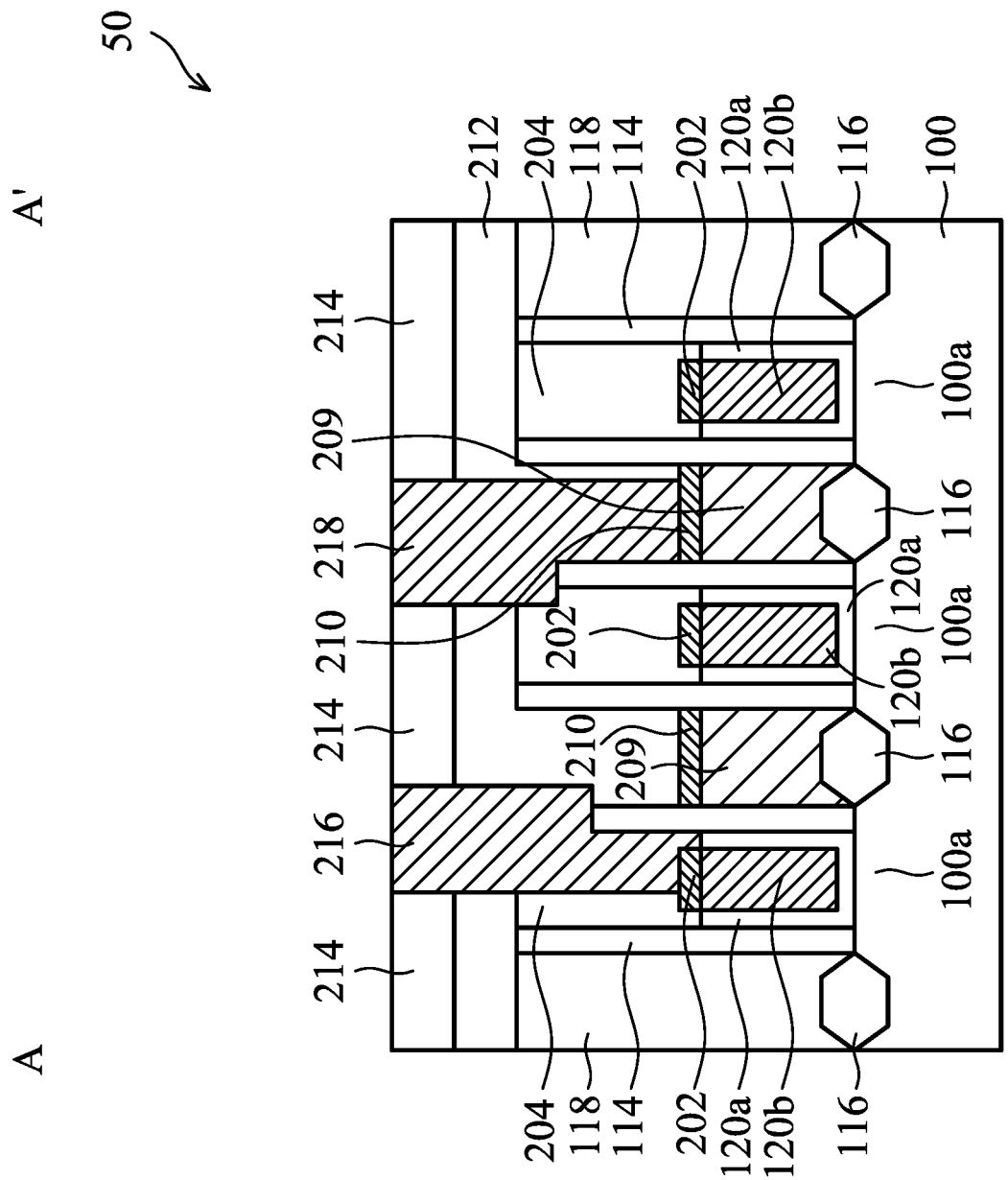
FIG. 5 illustrates a cross-sectional view of a semiconductor structure in accordance with some embodiments.

FIG. 5 illustrates a cross-sectional view of a semiconductor structure 50 in accordance with some embodiments. One difference between the semiconductor structure 50 and the semiconductor structure 20 is that the top surface of the gate dielectric layer 120a is level with the top surface of the gate electrode layer 120b.

Figure 6:
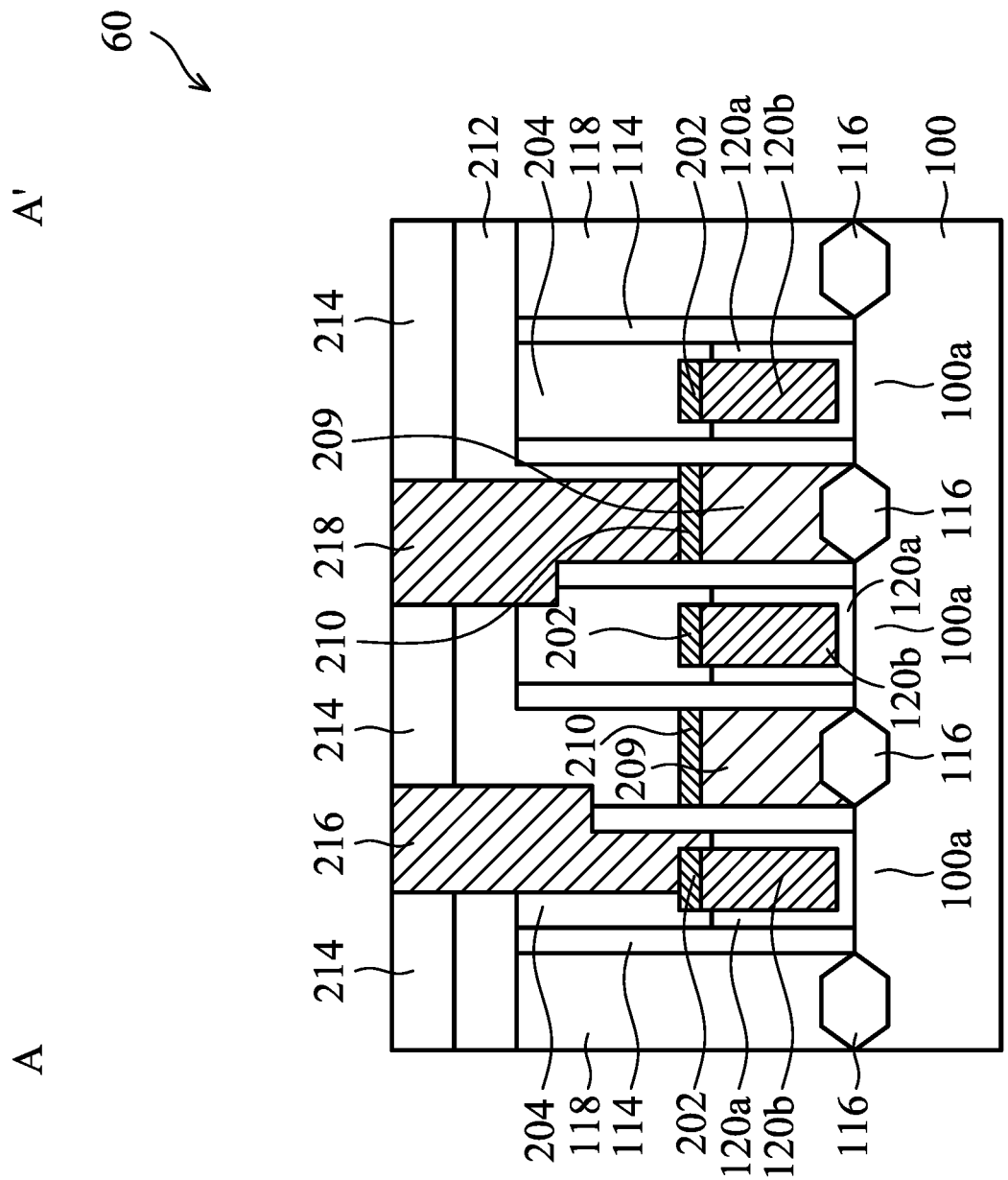
FIG. 6 illustrates a cross-sectional view of a semiconductor structure in accordance with some embodiments.

FIG. 6 illustrates a cross-sectional view of a semiconductor structure 60 in accordance with some embodiments. One difference between the semiconductor structure 60 and the semiconductor structure 20 is that the top surface of the gate dielectric layer 120a is lower than the top surface of the gate electrode layer 120b.

As described previously, in some embodiments, the metal cap layer 202 and the metal cap layer 210 are formed to protect the gate electrode layer 120b and the contact structure 209, so that the gate resistance and the contact resistance of the semiconductor structure 20 are low. The metal cap layer 202 and the metal cap layer 210 may include different halogens, so that the deposition process D2 for forming the metal cap layer 210 may use a halogen-containing precursor gas (e.g., the fluoride-containing precursor gas) which is different from the halogen-containing precursor gas (e.g., the chloride-containing precursor gas) used in the deposition process D1 for forming the metal cap layer 202. Therefore, the contact structure 209 may not be substantially damaged during the deposition process D2 for forming the metal cap layer 210.

Embodiments of methods for forming semiconductor structures are provided. The method includes forming a first metal cap layer on a gate electrode layer, and forming a second metal cap layer on a contact structure. The first metal cap layer and the second metal cap layer may protect the gate electrode layer and the contact structure during subsequent processes, and thus the performance of the semiconductor structure may be improved. The first metal cap layer and the second metal cap layer may include different halogens, and thus the first metal cap layer and the second metal cap layer may be formed using different halogen-containing precursor gases. Therefore, the contact structure may not be substantially damaged during the formation of the second metal cap layer.

In some embodiments, a semiconductor structure is provided. The semiconductor structure includes a fin protruding from a substrate and a gate stack formed across the fin. The semiconductor structure further includes a source/drain structure attaching to the gate stack and a contact structure connecting to the source/drain structure. The semiconductor structure further includes a first cap layer covering a top surface of the contact structure. In addition, the first cap layer includes a first halogen In some embodiments, a method for forming a semiconductor structure is provided. The method includes patterning a substrate to form a fin and forming a source/drain structure attaching to the fin. The method further includes forming a contact structure over the source/drain structure and introducing a first halogen-containing precursor on a top surface of the contact structure to form a first cap layer.

In some embodiments, a method for forming a semiconductor structure is provided. The method includes forming a fin protruding from a substrate and forming a source/drain structure over the fin. The method further includes forming a gate stack over the fin and recessing the gate stack to form a first recess. The method further includes forming a first halogen-containing cap layer at a bottom portion of the first recess and forming a first mask layer in the first recess.

In some embodiments, a method for forming a semiconductor structure is provided. The method includes patterning a semiconductor substrate to form a semiconductor fin, forming a source/drain structure on the semiconductor fin, forming a gate electrode layer across the semiconductor fin, forming a first halogen-containing metal cap layer on the gate electrode layer, forming a contact structure on the source/drain structure and connected to the source/drain structure, and forming a second halogen-containing metal cap layer on the contact structure. The first halogen-containing metal cap layer and the second halogen-containing metal cap layer include different halogens.

In some embodiments, a method for forming a semiconductor structure is provided. The method includes patterning a semiconductor substrate to form a semiconductor fin, forming a source/drain structure on the semiconductor fin, forming a first dielectric layer on the semiconductor substrate and covering the source/drain structure and the semiconductor fin, forming a gate electrode layer in the first dielectric layer and across the semiconductor fin, introducing a chloride-containing precursor on a top surface of the gate electrode layer to form a first metal cap layer on the top surface of the gate electrode layer, forming a contact structure in the first dielectric layer and connected to the source/drain structure, and introducing a fluoride-containing precursor on a top surface of the contact structure to form a second metal cap layer on the top surface of the contact structure. The first metal cap layer and the second metal cap layer include a same metal.

In some embodiments, a semiconductor structure is provided. The semiconductor structure includes a semiconductor fin protruding from a semiconductor substrate, a gate electrode layer on the semiconductor substrate and across the semiconductor fin, a first cap layer on the gate electrode layer, a source/drain structure over the semiconductor fin, a contact structure on the source/drain structure, and a second cap layer on the contact structure. The first cap layer includes a first metal and chlorine, and the second cap layer includes the first metal and fluorine.

In some embodiments, a semiconductor structure is provided. The semiconductor structure includes a fin protruding from a substrate and a gate stack formed across the fin. In addition, the gate stack includes a gate dielectric layer and a gate electrode layer formed over the gate dielectric layer. The semiconductor structure further includes a first cap layer formed over the gate stack and a first conductive structure formed over the first cap layer. In addition, the first cap layer includes a first halogen, and a portion of the first cap layer is sandwiched between the gate stack and the first conductive structure.

In some embodiments, a semiconductor structure is provided. The semiconductor structure includes a fin protruding from a substrate and a gate stack formed across the fin. The semiconductor structure further includes a first cap layer formed over the gate stack and a source/drain structure formed adjacent to the gate stack in the fin. The semiconductor structure further includes a contact structure formed over the source/drain structure and a second cap layer formed over the contact structure. In addition, the first cap layer and the second cap layer include different halogens.

In some embodiments, a semiconductor structure is provided. The semiconductor structure includes a fin protruding from a substrate and a gate stack formed across the fin. In addition, the gate stack includes a gate dielectric layer and a gate electrode layer formed over the gate dielectric layer. The semiconductor structure further includes a spacer formed on a sidewall of the gate stack and a source/drain structure formed adjacent to the gate stack in the fin. The semiconductor structure further includes a contact structure formed over the source/drain structure and a cap layer formed over the contact structure. In addition, the cap layer includes halogen.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a fin protruding from a substrate;
    a gate stack formed across the fin;
    a source/drain structure attaching to the gate stack;
    a contact structure connecting to the source/drain structure; and
    a first cap layer covering a top surface of the contact structure, wherein the first cap layer comprises a first halogen.

2. The semiconductor structure as claimed in claim 1, further comprising:
    sidewall spacers interposed the gate stack and the contact structure, wherein the first cap layer physically contacts the sidewall spacers.

3. The semiconductor structure as claimed in claim 1, further comprising:
    a first mask layer formed over the first cap layer; and
    a conductive structure formed through the first mask layer,
    wherein an interface between the first mask layer and the first cap layer is substantially level with an interface between the conductive structure and the first cap layer.

4. The semiconductor structure as claimed in claim 3, further comprising:
    a second mask layer formed over the gate stack, wherein a portion of the second mask layer vertically sandwiched between the conductive structure and the gate stack.

5. The semiconductor structure as claimed in claim 4, wherein a top surface of the second mask layer is lower than a top surface of the first mask layer.

6. The semiconductor structure as claimed in claim 3, further comprising:
    sidewall spacers sandwiched between the gate stack and the contact structure, wherein the conductive structure physically contacts a top surface and a sidewall surface of the sidewall spacers.

7. The semiconductor structure as claimed in claim 1, further comprising:
    a second cap layer formed over the gate stack, wherein the second cap layer comprise a second halogen different from the first halogen.

8. The semiconductor structure as claimed in claim 7, wherein the gate stack comprises:
- a gate dielectric layer; and
- a gate electrode layer formed over the gate dielectric layer,
- wherein the second cap layer physically contact a sidewall of the gate dielectric layer and covers a top surface of the gate electrode layer.

9. The semiconductor structure as claimed in claim 8, wherein a top surface of the gate dielectric layer is higher than an interface between the second cap layer and the gate electrode layer.

10. The semiconductor structure as claimed in claim 8, wherein a top surface of the gate dielectric layer is lower than a top surface of the second cap layer.

11. A method for forming a semiconductor structure, comprising:
- patterning a substrate to form a fin;
- forming a source/drain structure attaching to the fin;
- forming a contact structure over the source/drain structure; and
- introducing a first halogen-containing precursor on a top surface of the contact structure to form a first cap layer.

12. The method for forming a semiconductor structure as claimed in claim 11, wherein the first cap layer comprises the first halogen.

13. The method for forming a semiconductor structure as claimed in claim 11, further comprising:
- forming a gate stack over the fin adjacent to the source/drain structure; and
- introducing a second halogen-containing precursor on a top surface of the gate stack to form a second cap layer.

14. The method for forming a semiconductor structure as claimed in claim 13, wherein the second cap layer comprises the second halogen different from the first halogen.

15. The method for forming a semiconductor structure as claimed in claim 14, wherein the first cap layer and the second cap layer comprise a same metal.

16. A method for forming a semiconductor structure, comprising:
- forming a fin protruding from a substrate;
- forming a source/drain structure over the fin;
- forming a gate stack over the fin;
- recessing the gate stack to form a first recess;
- forming a first halogen-containing cap layer at a bottom portion of the first recess; and
- forming a first mask layer in the first recess.

17. The method for forming a semiconductor structure as claimed in claim 16, further comprising:
- forming a contact structure over the source/drain structure;
- recessing the contact structure to form a second recess;
- forming a second halogen-containing cap layer at a bottom portion of the second recess; and
- forming a second mask layer in the second recess,
- wherein the first halogen-containing cap layer and the second halogen-containing cap layer comprises different halogens.

18. The method for forming a semiconductor structure as claimed in claim 17, further comprising:
- forming a first trench through the first mask layer to expose the first halogen-containing cap layer; and
- forming a first conductive structure in the first trench,
- wherein a portion of the first conductive structure vertically overlaps the contact structure and is separated from the contact structure by the second mask layer.

19. The method for forming a semiconductor structure as claimed in claim 17, further comprising:
- forming a second trench through the second mask layer to expose the second halogen-containing cap layer; and
- forming a second conductive structure in the second trench,
- wherein a portion of the second conductive structure vertically overlaps the first mask layer.

20. The method for forming a semiconductor structure as claimed in claim 17, wherein the second mask layer covers a top surface of the first mask layer.

* * * * *